US006529843B1

(12) United States Patent
Carpenter

(10) Patent No.: US 6,529,843 B1
(45) Date of Patent: Mar. 4, 2003

(54) BEAT RATE TUNING SYSTEM AND METHODS OF USING SAME

(76) Inventor: David J. Carpenter, 5030 N. Nashville Ave., Chicago, IL (US) 60656

( * ) Notice: Subject to any disclaimer, the term of this patent is extended or adjusted under 35 U.S.C. 154(b) by 6 days.

(21) Appl. No.: 09/835,265

(22) Filed: Apr. 12, 2001

Related U.S. Application Data

(60) Provisional application No. 60/196,422, filed on Apr. 12, 2000.

(51) Int. Cl.[7] .......................... G01R 23/00; G10G 7/02

(52) U.S. Cl. ............................ 702/75; 84/454; 84/477; 84/604

(58) Field of Search ............................ 702/66, 70, 71, 702/74, 75, 76; 324/76.41, 76.51, 76.82; 84/454, 477 R, 604, 648, 616, 603, 672; 704/278; 705/29

(56) References Cited

U.S. PATENT DOCUMENTS

| | | | | |
|---|---|---|---|---|
| 2,924,776 A | | 2/1960 | Peterson | 324/76.51 |
| 2,958,250 A | | 11/1960 | Poehler | 84/454 |
| 3,509,454 A | | 4/1970 | Gossel | 324/76.41 |
| 3,631,756 A | | 1/1972 | Mackworth-Young | 84/454 |
| 3,696,293 A | | 10/1972 | Hoffmann et al. | 324/76.32 |
| 3,722,535 A | | 3/1973 | Westhaver | 84/454 |
| 3,766,818 A | | 10/1973 | Prohofsky | 84/454 |
| 3,901,120 A | | 8/1975 | Youngquist | 84/454 |
| 3,968,719 A | | 7/1976 | Sanderson | 84/454 |
| 3,982,184 A | | 9/1976 | Sanderson | 324/76.82 |
| 4,014,242 A | | 3/1977 | Sanderson | 84/454 |
| 4,018,124 A | | 4/1977 | Rosado | 84/723 |
| 4,142,434 A | | 3/1979 | Gross | 84/672 |
| 4,242,935 A | * | 1/1981 | Peterson et al. | 84/648 |
| 4,429,609 A | | 2/1984 | Warrender | 84/454 |
| 4,732,071 A | | 3/1988 | Deutsch | 84/454 |
| 4,796,509 A | | 1/1989 | Mizuguchi et al. | 84/454 |
| 4,991,484 A | | 2/1991 | Kawashima | 84/603 |
| 5,016,515 A | | 5/1991 | Scott | 84/454 |
| 5,056,398 A | | 10/1991 | Adamson | 84/454 |
| 5,111,392 A | | 5/1992 | Malin | 705/29 |
| 5,202,528 A | | 4/1993 | Iwaooji | 84/616 |
| 5,285,711 A | | 2/1994 | Sanderson | 84/454 |
| 5,349,130 A | | 9/1994 | Iwaooji | 84/616 |
| 5,388,496 A | | 2/1995 | Miller et al. | 84/454 |
| 5,396,827 A | | 3/1995 | Miller et al. | 84/454 |
| 5,440,756 A | | 8/1995 | Larson | 704/278 |
| 5,549,028 A | | 8/1996 | Steinberger | 84/454 |
| 5,719,343 A | | 2/1998 | Reyburn | 84/454 |
| 5,773,737 A | | 6/1998 | Reyburn | 84/454 |
| 5,777,248 A | | 7/1998 | Cambell | 84/454 |
| 5,780,759 A | | 7/1998 | Szalay | 84/454 |
| 5,814,748 A | | 9/1998 | Reyburn | 84/454 |
| 5,902,946 A | * | 5/1999 | Kogure et al. | 84/477 R |
| 5,929,358 A | | 7/1999 | Reyburn | 84/454 |
| 6,066,790 A | | 5/2000 | Freeland et al. | 84/454 |
| 6,137,046 A | * | 10/2000 | Kamiya | 84/604 |

OTHER PUBLICATIONS

David Roberts, *The Calculating Technician* (1990), pp. 29–46.

Rick Baldassin, *On Pitch* (1994), pp. 1–112 (entire book).

* cited by examiner

*Primary Examiner*—John S. Hilten
*Assistant Examiner*—John Le
(74) *Attorney, Agent, or Firm*—Robert Carpenter

(57) ABSTRACT

A system and methods for assisting a technician in tuning a musical instrument exhibiting inharmonicity, such as a piano. A display informs the technician of one or more beat rates associated with respective intervals of a note being tuned and other notes. A second display informs the technician of the phase difference between the note being adjusted and a reference signal. The note being tuned is detected automatically, thereby allowing the technician to work without constantly touching the system. The wavelengths emanating from the notes are determined accurately, and the corresponding frequencies are tested for their quality before being used in calculations used for providing the information for the displays. A tuning frequency is calculated for each note after measurement of a first note, and the calculation is updated as more measurements are taken. If desired, the technician may visit each note only once in the tuning of the musical instrument.

21 Claims, 20 Drawing Sheets

BEAT RATE TUNING SYSTEM AND METHODS OF USING SAME

RELATED APPLICATIONS

This application claims the benefit of priority to U.S. application Ser. No. 60/196,422, entitled "Electronic Tuning Device and Methods," filed Apr. 12, 2000, the entire disclosure of which is incorporated herein by reference. Furthermore, this application is related to U.S. application Ser. No. 09/835,267, entitled, "Note Detection System and Methods of Using Same," filed Apr. 12, 2001, and U.S. application Ser. No. 09/835,259, entitled "Electronic Tuning System and Methods of Using Same," filed Apr. 12, 2001, both of which are incorporated herein by reference in their entireties.

FIELD OF THE INVENTION

The present invention generally relates to tuning musical instruments, and more particularly, to methods and apparatus for use in the tuning of musical instruments having a plurality of adjustable frequency tone generators.

BACKGROUND

Musical instruments having a plurality of adjustable tone generators, or notes, are typically manually tuned by skilled technicians. In the tuning of a particular instrument, the technician, such as a piano tuning technician, relies upon the fundamental frequency as well as other additional frequencies produced by each note. In theory, each additional frequency produced for each note is a "harmonic" or integer multiple of the base frequency of the note. Furthermore, certain harmonics of a note have theoretical mathematical relationships with harmonics of other notes, allowing the technician to rely upon "consonance" between a note being tuned and a reference note.

However, in actuality, the relationships among the frequencies do not exactly follow the mathematical theory. Deviations from the ideal frequencies are caused by physical characteristics of the tone generators. For instance, in a piano, the thickness and the stiffness of the strings cause these deviations from the mathematical ideals. The actual frequencies produced by a tone generator are conventionally referred to as "partials." The phenomena causing the deviations between the actual partials and the ideal harmonics of a tone generator is often referred to as the "inharmonicity" of the musical instrument. The inharmonicity of a piano causes the partials of a vibrating piano string to be sharper or higher in frequency than would be expected from the harmonics for the string. Furthermore, other effects associated with the particular construction of an instrument can produce a related phenomenon resulting in the partials being be lower or flatter in frequency than the corresponding theoretical harmonic.

If the frequencies of the notes are tuned simply relying on theoretical mathematical relations, inharmonicity causes the piano to sound out of tune. Therefore, inharmonicity forces a technician to "stretch octaves" in order for them to sound pleasing.

Manual aural tuning continues to be the preferred method of tuning instruments such as the piano. However, tuning is a complex iterative aural process which requires a high level of skill and practical experience, as well as a substantial amount of time. Some prior methods and devices have sought to simplify the tuning process by providing calculations of estimated tuning frequencies.

One such method and device is disclosed in U.S. Pat. No. 3,968,719, and later improved upon in U.S. Pat. No. 5,285,711, both issued to Sanderson. In the latter patent, an electrical tuning device measures the inharmonicity between two partials on each of three notes and calculates an eighty-eight (88) note tuning curve. The calculation of the eighty-eight (88) note tuning is performed using equations which rely on inharmonicity constants calculated from only three measured notes.

A problem with the method and device disclosed by the Sanderson patent is that the inharmonicity constants determined from just three notes are either not accurate or are not accurate for the entire instrument being tuned. It is also inflexible in that it does not allow using different octave stretches specific to certain note ranges, as is conventional in aural tuning.

Another method is disclosed in U.S. Pat. Nos. 5,719,343, 5,773,737, 5,814,748, and 5,929,358, all issued to Reyburn. The Reyburn patents describe a method where the tunings of the A notes are calculated with regard to an instrument's measured inharmonicity of these same A notes, and the remainder Of the notes are calculated as an apportionment of the octaves formed by these A notes.

Both the Sanderson and the Reyburn methods are limited in that they can only base calculations on a small number of inharmonicity readings. Since only one partial is being tuned per note, the lack of inharmonicity readings leaves the frequencies of the remaining partials as only estimates. As a consequence, it is difficult to obtain smoothly progressing intervals using the Sanderson or Reyburn methods and devices. Furthermore, these methods require time consuming measurements before actual tuning can begin, in which it is only practical to measure a few notes, therefore leaving the calculations to estimate the inharmonicity of the remaining notes.

Most aural tuning technicians usually visit notes only once and consider several partials of each note being tuned by using aural interval tests. The prior methods are contrary to this preferred method in that some notes must be visited twice, once during measuring and once during tuning. Moreover, none of the prior methods consider multiple partials for all the notes.

The Reyburn patents also disclose a method for digitally measuring wavelengths and frequencies by counting the number of samples between the zero crossing points at the starting and ending times of a sequence of cycles of a signal over a period of time approaching 300 milliseconds. These methods are limited in their accuracy because they depend on the sample rate and do not evaluate the regularity of the measurements to determine during which time periods the frequency has settled into a consistent state.

The Reyburn patents also disclose a device and a method for automatically detecting which note has been energized by the technician. The device filters a signal for a particular partial that would be produced by a note within one to four notes of the one previously energized. The drawback to this method is that there is a limited range of movement to which the technician is confined, notes of different octaves are indistinguishable, and it is not possible to jump to any note on the instrument.

Prior tuning displays use the metaphor of movement or rotation to indicate whether the note being tuned is sharp or flat as compared to a reference frequency, and the speed of movement or rotation indicates by how much. U.S. Pat. No. 3,982,184, issued to Sanderson, describes a display like this based on the phase difference of two signals; however it is severely limited in its sensitivity to display phase differences less than 90°. The Reyburn patents describe a rotating display that is based on pitch and not phase. This has the limitation of a slow response since it must measure the pitch over a series of many cycles before a change in the display can be effected.

An ideal electronic tuning device would provide the technician with the best quality tuning possible with the least number of actions. Furthermore, since inharmonicity is not entirely consistent from one note to the next, an ideal electronic tuning device would assist the technician in making compromises so that the majority of intervals sound correct, with each of the intervals being determined by different partials. The ideal electronic tuning device would calculate wavelengths and frequencies in a precise manner with some consideration of the quality of the signal and calculation. The ideal electronic tuning device would also allow for automatic note detection of any note on an instrument at any time.

Accordingly, there continues to be a need for an improved tuning method and device which can assist technicians in providing more accurate and efficient tuning of musical instruments.

SUMMARY

Therefore, the present invention provides novel tuning methods and systems which allow for accurate tuning of musical instruments having inharmonicity by considering multiple partials of each and every note.

In one aspect of the invention, a method is provided for use in tuning a musical instrument having a plurality of adjustable frequency tone generators. The method includes measuring a frequency of a partial of a first tone generator of the plurality of tone generators, and measuring a substantially real-time frequency of a coincident partial of a second tone generator of the plurality of tone generators. A difference between the frequency of a partial of the first tone generator and the substantially real-time frequency of a coincident partial of the second tone generator is calculated, and an indicator representative of the calculated difference is displayed.

In another aspect of the invention, a method is provided for use in tuning a musical instrument having a plurality of adjustable frequency tone generators. The method includes measuring a frequency of a partial of a first tone generator of the plurality of tone generators, and measuring a substantially real-time frequency of a coincident partial of a second tone generator of the plurality of tone generators. A difference between the frequency of a partial of the first tone generator and the substantially real-time frequency of a coincident partial of the second tone generator is calculated. Then, the second tone generator is adjusted based upon the calculated difference.

In yet another aspect of the invention, a method is provided for use in tuning a musical instrument having multiple adjustable frequency tone generators. The method includes measuring a frequency of one or more partials of a plurality of the multiple tone generators, and measuring a substantially real-time frequency of one or more coincident partials of a selected tone generator. Next one or more differences between a frequency of a partial of one or more tone generators of the plurality of tone generators and the substantially real-time frequency of the coincident partials is calculated. Then, one or more indicators representative of the calculated differences are displayed. In another aspect of the invention, a system for use in the tuning of musical instrument having a plurality of adjustable frequency tone generators is provided. The system includes a wave sampler, a signal processor, a calculator, and a display. The wave sampler is capable of converting sound into an electrical signal. The signal processor receives the signal and is adapted to determine a frequency for each of one or more partials of the sound. The calculator is capable of calculating at least one difference between a measured frequency of a partial of one or more tone generators of the plurality of tone generators and a measured substantially real-time frequency of a partial of a selected tone generator. The display is representative of the one or more calculated differences.

Other aspects of the invention will be apparent to those skilled in the art in view of the following detailed description of the preferred embodiments, along with the accompanying drawings.

DETAILED DESCRIPTION

Figure 1:
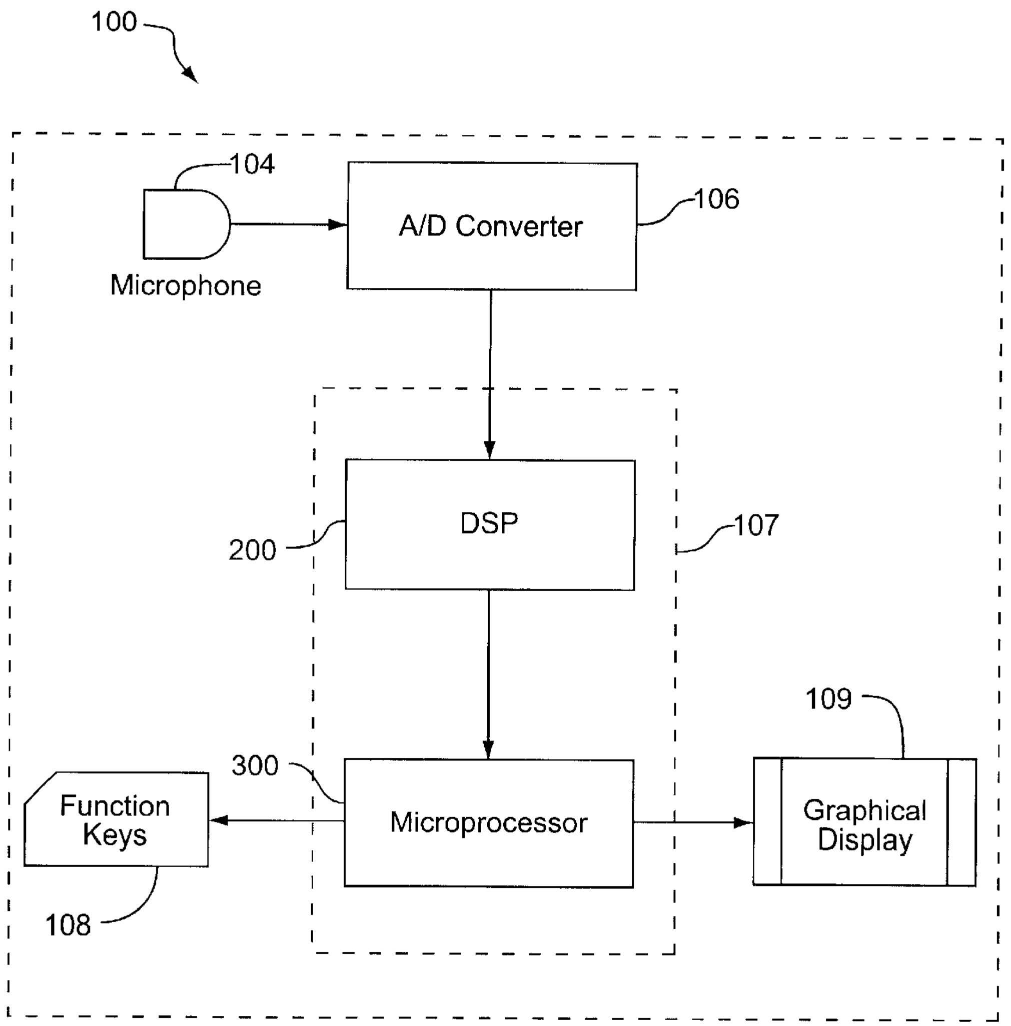
FIG. 1 is schematic of a system according to the present invention.

Referring now to the drawings in general and FIG. 1 in particular, a preferred embodiment of a system according to the present invention is shown generally at 100. The system 100 is meant to be used by a technician in the course of tuning a musical instrument having inharmonicities, such as a piano. The components of the system 100 may be contained within a single housing in a convenient stand alone unit, or may be a combination of software and hardware, such as a combination including a personal computer.

The system 100 includes a wave sampler defined by a microphone 104 and an analog-to-digital converter 106. The wave sampler acts to convert a sound from the instrument into a digitalized signal representative of the sound wave. Suitable microphones and analog-to-digital converters will be apparent to those skilled in the art. An example of a suitable microphone is an Electret Condensor Microphone Cartridge sold by Panasonic, Part No. WM-52BM, and distributed by Allied Electronics, Inc. of Fort Worth, Tex. An example of a suitable analog-to-digital converter is a Sigma Delta Interface Circuit sold by Texas Instruments, Part No. TLC320AD50C, also distributed by Allied Electronics, Inc.

The digitized signal is received by a processor 107. In the preferred embodiment shown, the processor 107 includes a digital signal processor 200 and a microprocessor 300. However, in alternate embodiments of the invention, the processor 107 includes a single integrated processor, such as a microprocessor, and all the functions described herein with respect to the digital signal processor 200 are performed by the single processor. In further embodiments, multiple processors are used.

In the embodiment shown in FIGS. 1 and 2, the digital signal processor 200 is programmed, as more fully explained below, to detect which note of a musical instrument corresponds to the sound wave sampled by the wave sampler, and calculates tuning characteristics in substantially real time as the technician adjusts a note. As used throughout this description, the use of the term "substantially real time" with a particular action means that the action occurs nearly instantaneously, subject only to the time needed to perform calculations and to the limitations on the speed of any electronic equipment involved with the action. Suitable programmable digital signal processors will be apparent to those skilled in the art. An example of a suitable programmable digital signal processor is the TMS320VC5410 sold by Texas Instruments of Dallas, Tex.

A control processor or microprocessor 300 receives the information determined and calculated by the digital signal processor 200. As described in detail below, the microprocessor 300 is programmed to use the information received to calculate target tuning frequencies and related tuning information. Preferably, the calculated target tuning frequencies and related tuning information are displayed on one or more graphical displays 109. Suitable programmable microprocessors will be apparent to those skilled in the art. An example of a suitable programmable microprocessor is the SH-4 sold by Hitachi Semiconductor (America), Inc. of San Jose, Calif.

Once the system 100 is energized and readied for use, the system 100 is designed to operate in a "hands-off" state, that is, it is designed to perform note detection, to perform tuning calculations, and to display tuning information independently without further physical contact with the technician. However, as explained in detail below, there may be occasion for the technician to override the automatic processes of the system 100, or to provide the system 100 with alternate or additional information. The microprocessor 300 is thus in communication with various function keys 108 for allowing the technician to override these processes or to provide such information.

Figure 2:
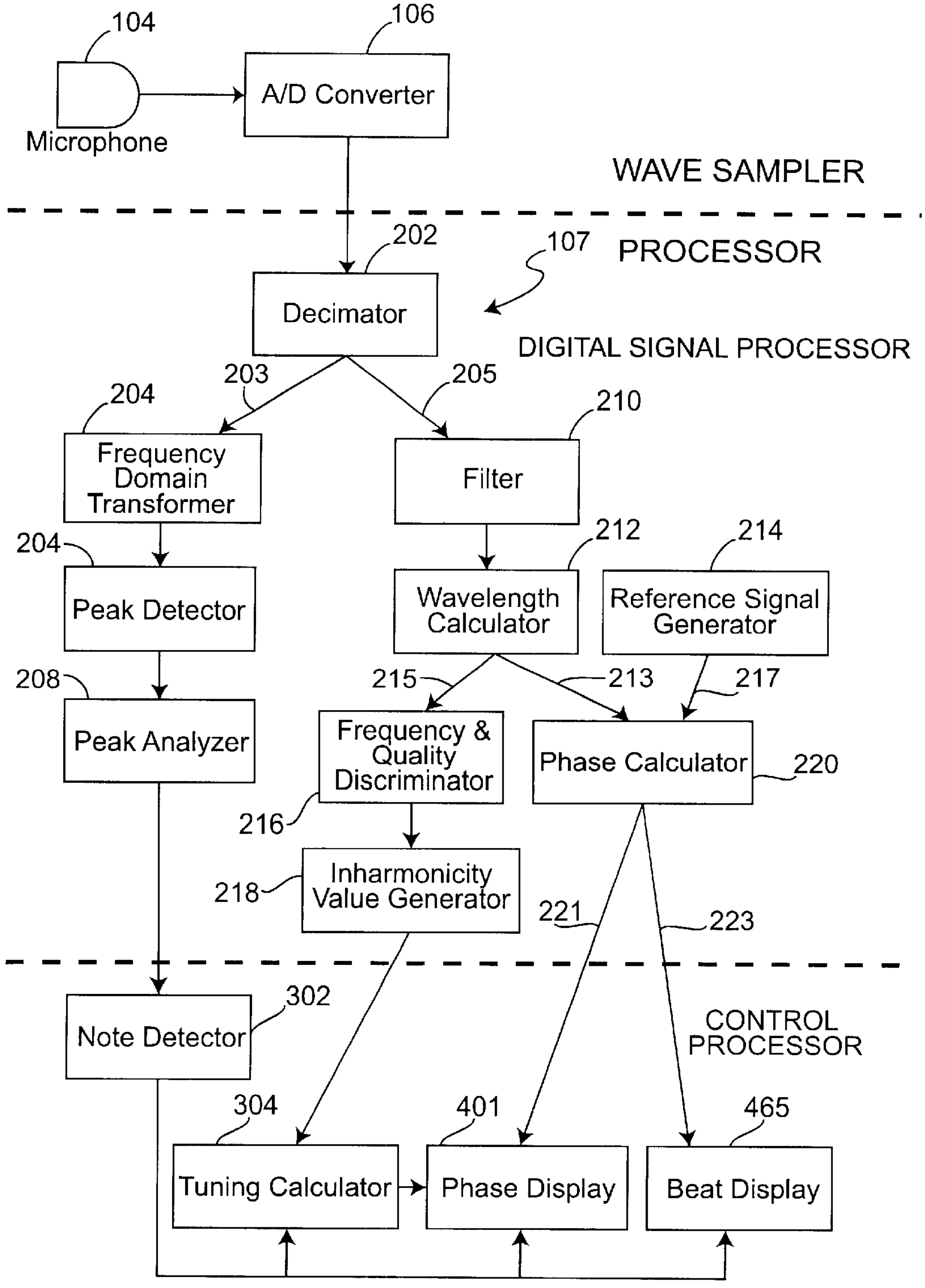
FIG. 2 is schematic of the system of FIG. 1 which includes functional sub-units and sub-systems.

FIG. 2 shows a more detailed schematic of the system 100, with particular reference to the processor 107. The processor 107 includes a decimator 202 which receives a digitalized signal from the analog-to-digital converter 106. The decimator 202 reduces the sampling of the digital signal to various rates.

The decimator 202 then sends a signal to each of two units of the processor 107. The decimator 202 sends a signal 203 to a sub-system to be used for identification of the note of a musical instrument corresponding to the sampled sound wave. Various note detection systems are known in the art and are suitable with the present invention. However, one especially preferred embodiment of a novel note detection sub-system according to the present invention is described in detail below in Section 1 entitled "Automatic Note Detection" and with reference to FIGS. 8–11, and in FIG. 2. Briefly, FIG. 2 shows signal 203 entering a system of decimators and Fast Fourier Transforms defining a frequency domain transformer 204. The frequency domain transformer 204 separates the signal into a spectrum of frequencies. A peak detector 206 then acts to identify the strongest frequencies of the tone generator. From the peak detector 206, a signal representative of the strongest frequencies is sent to a peak analyzer 208. The peak analyzer 208 uses the identified peaks to identify candidate fundamental pitches and scores these candidate fundamental pitches against the spectrum of frequencies. The information determined by the peak analyzer 208 then exits the processor 107, and is received by a note detector 302. The note detector 302 determines which note of the musical instrument corresponds to the sampled sound wave by analyzing the scores determined by the peak analyzer 208.

The decimator 202 also sends a separate signal 205 for processing by other sub-units of the processor 107. The signal 205 is preferably first received by one or more filters 210. The filters 210 isolate individual partials from the signal. The filters 210 then preferably send the partials to a wavelength calculator 212 for determining the precise wavelength of each isolated partial of the sampled sound wave. Any unit for calculating wavelengths that is known in the art may be used with the present invention. An especially preferred embodiment of the wavelength calculator 212 is described in detail in Section 2 below entitled "Determination of a Digital Wavelength," and with reference to FIG. 12.

Figure 14:
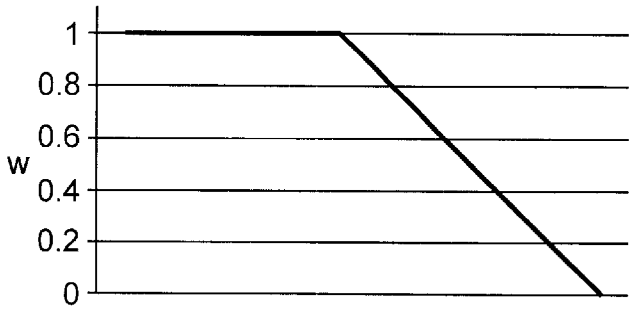
FIG. 14 is a plan view of a graph illustrating the weighting of measurements of a changing frequency according to a preferred embodiment of a method according to the present invention.

From the wavelength calculator 212, a signal may be sent to each of two sub-units of the processor 107. A first signal 215 is preferably sent to a frequency and quality discriminator 216. An especially preferred embodiment of the discriminator 216 is described in detail in Section 3 below entitled "Measurement of a Changing Frequency," and with reference to FIGS. 14–15. Briefly, the discriminator 216 accounts for changes in frequency of a tone generator during the tuning process and prevents unreliable or low quality frequency measurements from being used in the downstream tuning calculations.

Figure 16:
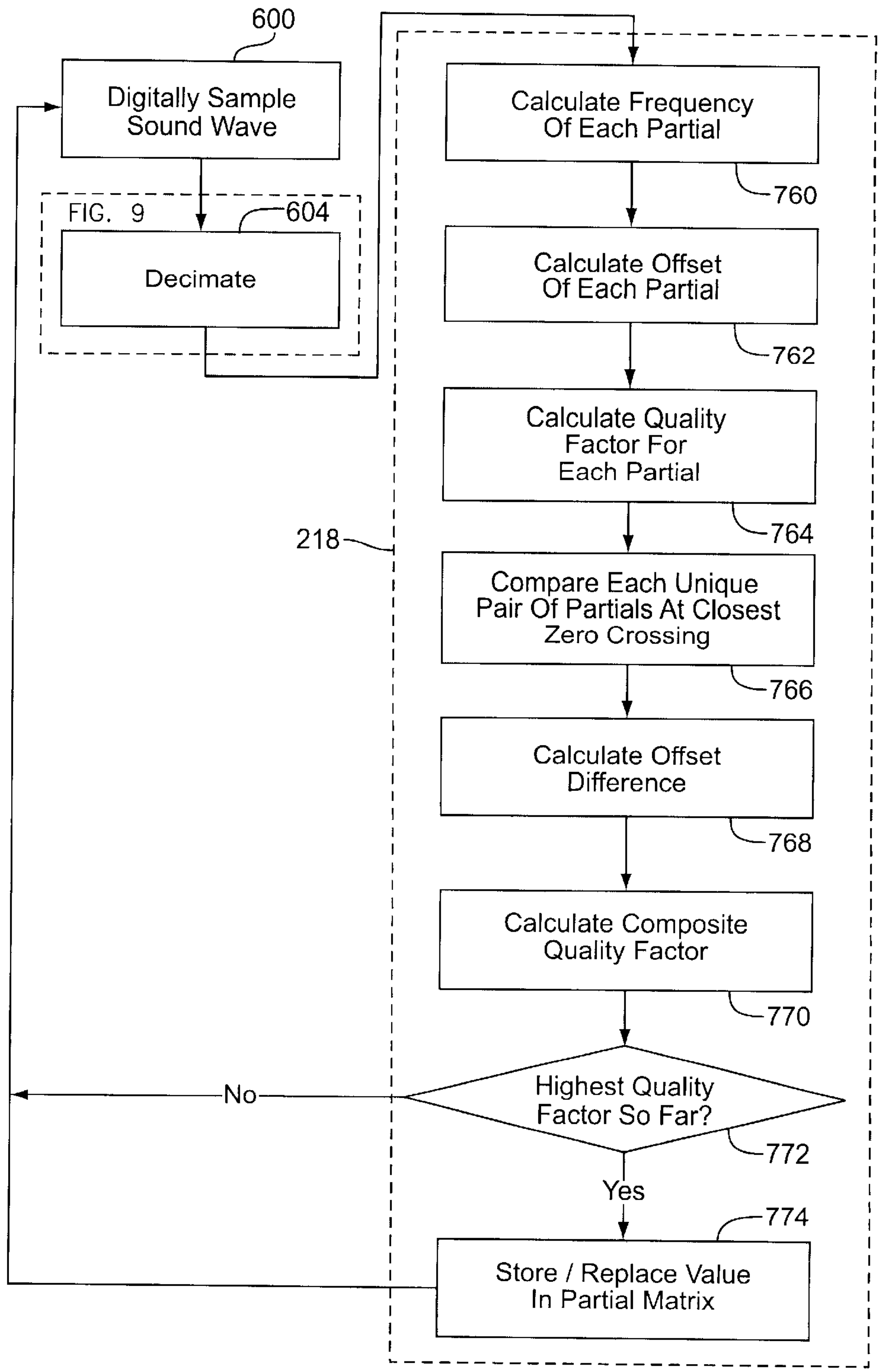
FIG. 16 is a flow diagram of a preferred embodiment of a method for constructing an inharmonicity value matrix according to the present invention.

From the discriminator 216, a signal representative of reliable and high quality measurements of frequencies is sent to the inharmonicity value matrix generator 218. The operation of an especially preferred embodiment of the inharmonicity value matrix generator 218 is described in detail below in the Section 4 entitled "Construction of a Partial Matrix," and with reference to FIGS. 16–17. Briefly, the inharmonicity value generator 218 determines and stores inharmonicity values corresponding to a mathematical relationship between unique pairs of frequencies corresponding to unique pairs of partials of the tone generator being sampled. An inharmonicity value is preferably determined for several pairs of partials, and in an especially preferred embodiment, for substantially each and every combination of partials. The values determined in the inharmonicity value generator 218 are sent to the tuning calculator 304. The details of the operation of an especially preferred embodiment of tuning calculator 304 are described in detail in the Section 5 below entitled "Calculation of Ideal Tuning Frequencies", and with reference to FIGS. 18 and 19. Briefly, the tuning calculator 304 receives information from the inharmonicity value generator 218 and calculates an ideal tuning frequency for one or more partials of each and every note of the musical instrument. This tuning calculator 304 recalculates the ideal tuning frequencies every time a new note is measured, and the ideal tuning frequencies become more accurate as more notes are measured.

The wavelength calculator 212 also preferably sends a signal 213 to a phase calculator 220. The details of an especially preferred embodiment of the phase calculator 220 are described in Section 6 below entitled "Cumulative Phase Difference," and with reference to FIGS. 3A, 3B and 20. Briefly, in addition to signal 213, the phase calculator 220 receives a signal 217 from a reference signal generator 214. The reference signal generator 214 produces regular events, such as zero crossings of a sine wave. The phase calculator 220 determines the phase difference between the signal 213 and signal 217 over time. The phase calculator 220 then sends signal 221 to a phase display 401 so that the technician can use the calculation in substantially real time while adjusting tone generators of the instrument.

The phase calculator 220 also sends a signal 223 for use with the beat display 465. The details of an especially preferred embodiment of the beat display 465 are described in Section 7 below entitled "Interval Beat Rates," and with reference to FIGS. 6 and 21. Briefly, the processor receives information from the phase calculator 220, as well as other information available in the processor, such as the identity of a note being tuned (from note detector 302). The beat display 465 provides a display of one or more beat rates between a tone generator being tuned and one or more other tone generators. The information can be used in substantially real time by a technician adjusting the tone generator being tuned.

FIGS. 3–6 illustrate a particularly preferred embodiment of a system 100 according to the present invention. The system in FIGS. 3–6 is contained within a single housing 102 and is intended to operate as a convenient stand-alone device. The system 100 may be powered by a battery (not shown) contained within the housing, or by a external power supply (not shown), as is conventional in the art. The housing 102 may be any housing known in the art suitable for containing and protecting electronic components. Suitable housings include the customized thermoplastic casings sold by EAI Enclosures of Libertyville, Ill.

A front face 105 of the housing 102 includes the function keys 108 and the display 400. One or more function keys 108 are associated with instruction indicators 402–411 on an instruction indicator row along the bottom of the display 400. For example, functions keys 110*a*, 110*b*, 110*c*, and 110*d*, all are associated with the instruction indicator 402 labeled "MENU". Likewise, function key 112*a* is associated with instruction indicator 404 labeled "NOTE+". Referring to FIG. 4, pressing the function key 110*b* will display a main menu 440. One of the main menu items is highlighted in reverse text ("View" in the example shown in FIG.4), indicating the currently selected item. To change the selected item on the main menu 440, the technician simply would press either function key 110*d* to move down, for example, to "Tuning", or would press function key 110*b* one or more times to move up to "Temperament" or other items, respectively, on the main menu 440. Once the proper item is selected on the main menu 440, the technician presses function key 110*c* to view a secondary menu 442. In the example shown in FIG. 4, by pressing the right arrow 110*c* and down arrow 110*d*, the secondary menu choice "Spectrum" is highlighted. Then by pressing function key 118*a*, which now corresponds to instruction indicator 444 labeled "Go", the view is changed to the Spectrum Display (as indicated by view designator 490) shown in FIG. 5. The Spectrum Display in FIG. 5 includes a plurality of partial designators 460, and a plurality of corresponding amplitude indicators 461. Thus the technician is able to navigate various display views and operational modes of the system 100 to customize his or her particular tuning preferences, to store data, to view particular characteristics of the instrument being tuned, etc. It should be noted that the instruction indicators above the function keys 108 change depending on the view displayed. Those skilled in the art will appreciate that the particular images shown in and strategies described with respect to the display 400 of FIGS. 3–6 are exemplary and other alternate images made be used with the system of the present invention.

Referring again to FIG. 3A, the note indicator 412 displays the most recent note as detected by the Note Detector 302 (FIG. 2). The phase indicator 448 indicates whether the tone generator as identified in the note indicator 412 is shalp or flat. When the note is sharp, then the phase indicator 448 will rotate to the right, and when the note is flat, the phase indicator 448 will rotate to the left. There are two scales of rotation. The coarse phase indicator 450 rotates at a slow speed to be easily read when the tone generator is far off pitch, and the fine tuning phase indicator 452 rotates at a much faster speed to easily fine tune a tone generator to an exact pitch. At the times when the tone generator is far off pitch, the fine tuning indicator transforms into a multiple pattern 453 (shown in FIG. 3B) to indicate that its spinning too quickly to be seen.

The display 400 also preferably has an Inharmonicity indicator 414 which indicates the quality of inharmonicity measurements taken thus far on the selected note all The quality of such measurements are described below in Section 4 below entitled "Construction of an Inharmonicity Value Matrix". The display 400 also includes a locking indicator 420 which indicates whether the calculated target frequencies for the selected note have been locked. As shown in FIG. 3B, after the technician has completed tuning the selected note, the locked position indicator 419 is displayed over the locking indicator 420 to indicate that this note has been tuned, and that no further changes will be made to the calculated tuning targets for this note.

In the preferred embodiment shown in FIG. 3A, the display 400 also includes a standard pitch indicator 422 for indicating the amount in cents that the standard pitch is set above or below 440.00 Hz, a stretch adjust indicator 424 for displaying the technicians preference for octave widths (which may be entered using the function keys 108), a frequency indicator 426 for displaying the difference between the selected note's target and measured pitch, and a plurality of partial designators 428 each having a corresponding target offset indicator 430 which illustrates the calculated target frequency of each partial. It will be readily apparent to those skilled in the art that many alternate combinations and arrangements of indicators may be used with the display 400 of the system 100.

Figure 6:
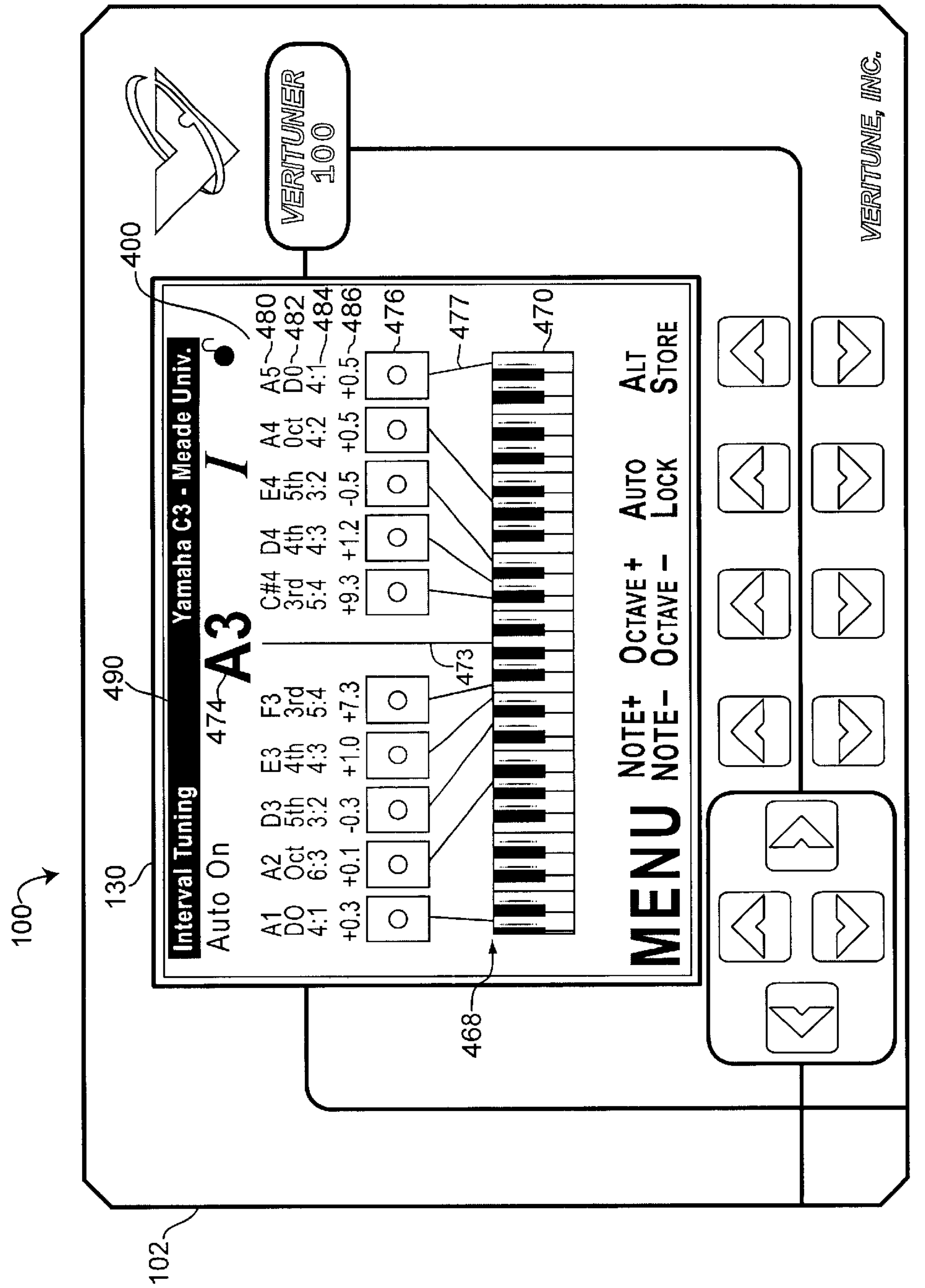
FIG. 6 is a plan view of interval beat rate tuning mode view of a preferred embodiment of a display according to the present invention.

FIG. 6 illustrates an example of an alternate mode of tuning that may be selected by the technician using system 100. As shown in the view designator 490, the view shown in FIG. 6 is the "Interval Tuning" mode of the system 100. In Interval Tuning mode, the display 400 includes a beat rate display 468 which shows the aural beat rates of various intervals surrounding the note to be tuned. The note to be tuned is identified by note designator 474, and is identified on a graphical representation of a portion of a keyboard 470 by the lead line 473. The note names for each surrounding tuning interval is identified by a plurality of note designators 480, and the type of interval formed is identified by the musical interval designators 482 and coincident partial designators 484. While the tone generator is being adjusted, the beat indicators 476 pulse at the beat rates formed with the note being tuned. Simultaneously, the beat rate indicators 486 numerically display the beat rates in the unit of beats per second. The operation of the system in Interval Tuning Mode is described more fully in Section 7 below entitled "Interval Beat Rates." In the preferred embodiment just described, information calculated by or stored in system 100 is visually displayed to the technician by display 400. The display 400 preferably has at least one visual indicator representative of a calculated target frequency, of a difference between a calculated target frequency and a substantially real time frequency, or of beat rate, etc. However, in alternate embodiments of the invention, the system 100 may produce other physical manifestations that communicate information, such as target frequencies, frequency differences, phase differences, beat rates, etc. For example, the physical manifestations may include an audio signal, or vibrations. In other alternate embodiments of the invention, the system 100 produces no physical manifestations, but rather is integrated into a system that provides for automated adjustment of tone generators without the need for a technician.

Figure 7:
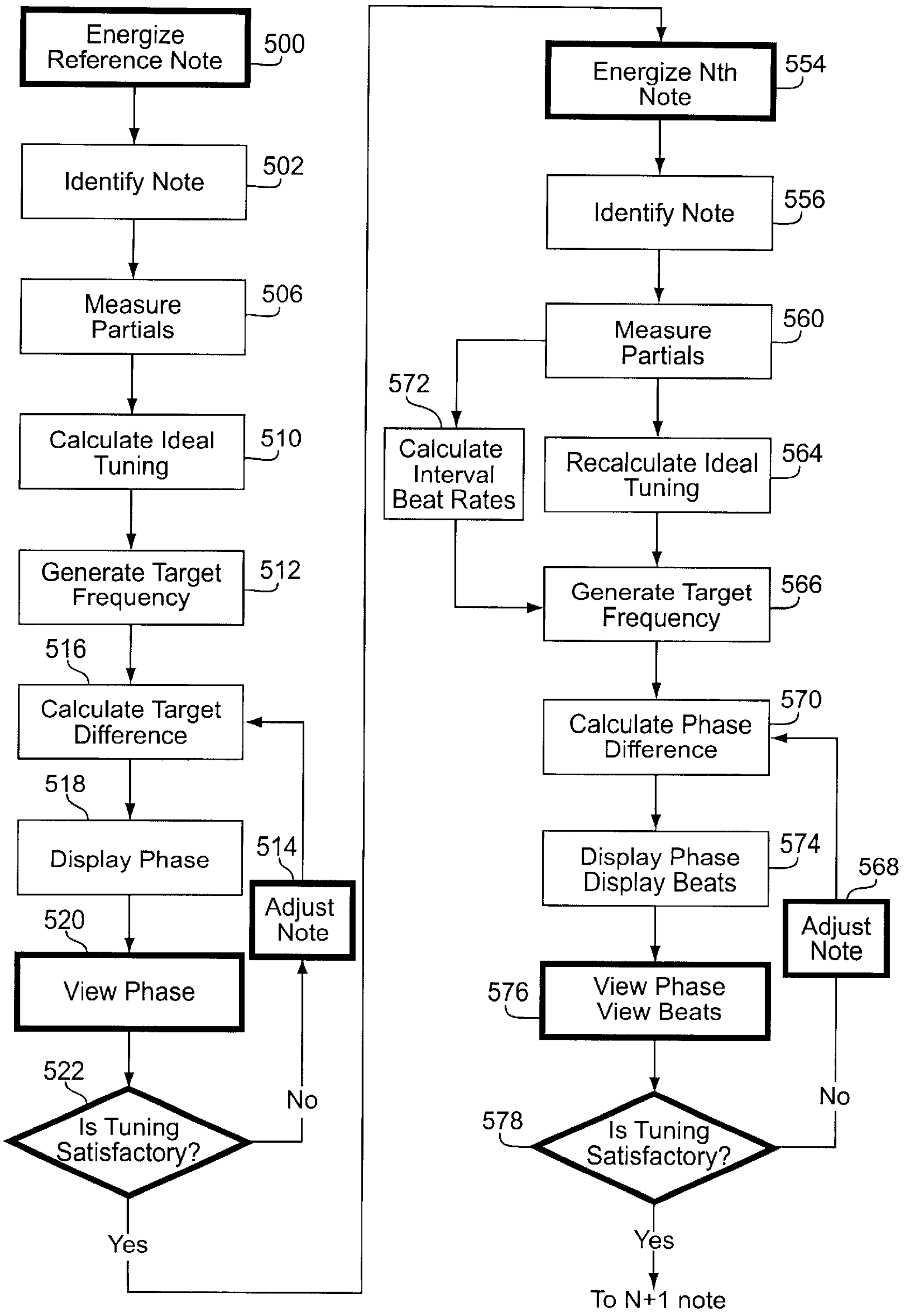
FIG. 7 is a flow diagram of a preferred embodiment of a method of tuning a musical instrument according to the present invention.

FIG. 7 illustrates a flow diagram for a preferred use of the system by a technician for single pass, substantially real time tuning of a musical instrument. For clarity, the diagram elements relating to an action of the technician have a thicker border than the diagram elements relating to an action of the system 100. While the present invention is generally applicable to a variety of musical instruments including, for example, harpsichords, organs and pianos, it will be in specifically described herein with reference to the tuning of pianos.

After energizing the system 100, such as by pushing a start button (not shown), the technician will typically begin with a reference note. On a piano, the reference note most often used is designated A4, and its first partial is typically tuned to 440 Hz which is the international standard pitch, although the technician may choose an alternate pitch. As shown in FIG. 7, the tuning process begins when the technician energizes a reference note as indicated at 500 in FIG. 7. The system 100 identifies (at 502) the note, as was previously briefly described with reference to the preferred note detection sub-system and as more thoroughly described below in the Section 1 below entitled "Automatic Note Detection." On a piano, the treble notes have three substantially identical tone generators, the upper bass notes have two substantially identical tone generators, and the lower bass notes have only one tone generator. Typically a technician will "mute" all but one of the tone generators of each note and tune the un-muted tone generators for each note. When each tone generator has been substantially tuned to its target frequencies, the Tuning Calculator 304 will lock the calculated frequencies for that tone generator so that they will not be changed by subsequent recalculations of the tuning. One way the system 100 may recognize that a tone generator has been tuned is for the measured frequency of the tone generator to continuously be within a specified tolerance of the target frequency for a minimum specified time. After completing the tuning of a single tone generator for each note of the piano, the technician will aurally tune the remaining tone generator(s) of a particular note against the tone generator that has already been tuned. The system 100 will measure (at 506) all partials of the reference note and construct and store a inharmonicity value matrix for the reference note. The inharmonicity value matrix includes at least one inharmonicity value, each value representing a fixed mathematical relationship between each and every unique measureable partial of the reference tone generator. Assuming tuning is not locked, these values are then used to calculate (at 510) an ideal tuning frequency, in the preferred embodiment, for substantially all partials of substantially all notes or tone generators of the instrument. The calculation may be based solely on the inharmonicity value matrix of the reference note as just measured. Alternately, the calculation may be based on the inharmonicity value matrix of the reference note and other partial matrices that have been previously stored, such as from a previous tuning of the presently tuned musical instrument.

As used herein, "substantially all partials" includes all or nearly all partials that are readily measurable and that are particularly useful for the tuning calculation. Furthermore, "substantially all notes" and "substantially all tone generators" includes all or nearly all of the notes or tone generators that are require measurement of partials so that the system can produce tuning calculations. For example, on a piano, the higher order partials of the highest octave are not particularly useful in the tuning calculations, and ideal tuning frequencies for other than the fundamental frequency of these notes are typically not calculated. In addition, while the very lowest notes on piano would allow for measurement of about eighteen different partials, the highest several order partials of those eighteen would not be particularly useful to either the tuning calculations as described herein, or to an aural technician. Those skilled in the art will recognize those partials that are particularly useful to the tuning calculations. In a preferred embodiment of a use of the present invention to tune a piano, an ideal tuning frequency is calculated for the first eight partials of the lowest fifty-two notes, for the first four partials of the next twelve notes, two partials for the next twelve notes, and one partial for the highest twelve notes.

The system 100 then generates (at 512) a target frequency for the reference note from the reference pitch selected by the technician. After the target frequency is generated, a phase difference is calculated (at 516) almost instantaneously. The system 100 then displays (at 518) the phase difference. In the preferred embodiment, the phase difference is displayed as a phase indicator 448 as shown in FIGS. 3A and 3B, the operation of which is described in detail below in Section 6 entitled "Cumulative Phase Difference."

The technician therefore has almost instantaneous feedback as to whether the reference note was correctly adjusted, and accordingly, receives substantially real time feedback. The technician decides (at 522) whether tuning is satisfactory based upon the technician's viewing of the phase display 401. If the adjustment was not satisfactory, technician can again adjust (at 514) the reference note and the process of calculating the phase difference and displaying the difference on the phase indicator 401 is repeated. It is noted that the system 100 is preferably fast enough such that the adjustment (at 514), the viewing (at 520), the decision (at 522) whether to continue the adjusting the reference note, and repeat adjustments often will merge into one continuous act of the technician. Specifically, the technician may slowly adjust the tone generator with a tuning hammer while watching the phase display, and instantaneously decide whether to continue adjusting the tone generator.

As shown in FIG. 7, after the reference note has been tuned, the second note, as well as all the remaining notes, may be tuned as shown beginning with the energizing (at 554) of the Nth note. The Nth note is identified (at 556) by the note detector 302 and related systems as described in the section below entitled "Automatic Note Detection." The partials of the Nth note will be measured (at 560) and an inharmonicity value matrix for the Nth note will be constructed.

After construction of the inharmonicity value matrix for the second note, the ideal tuning frequencies for all partials of all notes which are not locked will be recalculated (at 564). An especially preferred embodiment of this calculation is fully described in the section below entitled "Calculation of Ideal Tuning Frequencies." It is noted that these newly calculated frequencies will be as accurate, and in most cases, more accurate than the frequencies calculated after the measurement of only the reference note and any previously measured notes. Simultaneously, the system will calculate interval beat rates (at 572), as described in more detail in Section 7 below entitled "Interval Beat Rates."

The system 100 then generates (at 566) a target frequency for the Nth note from the just re-calculated ideal tuning frequencies of the notes. Had tuning been locked the target frequency would have been generated from previously calculated data. After the target frequency is generated, almost instantly the phase difference is calculated (at 570). Just as before, the phase difference is displayed (at 574), such as by a phase indicator 448 as illustrated in FIGS. 3A–3B. However, beginning with the second note, the technician may choose an alternate mode of tuning using the system 100. An especially preferred embodiment of this calculation is fully described in the Section 7 below entitled "Interval Beat Rates". Based upon these calculations, one or more beat rates will also be displayed (at 574) if the beat rate mode is selected. In a preferred embodiment as shown in FIG. 6, the beat display includes an image representative of at least a portion of a piano keyboard, with beat rate indicators proximate a note that forms an tuning interval with the note being tuned. While in the embodiment shown in FIGS. 3–6 illustrates the beat display and the phase display on separate views of the display, those skilled in the art will recognize that the display could be readily altered to show both the beat display and the phase display on the same view.

The technician may then view (at 576) either the phase display 401 or the beat display 465, or both, and then decide (at 578) whether the tuning of the second note is satisfactory. If the technician chooses to rely upon the beat rate or rates displayed, the technician will often make compromises in order to produce ideal beat rates for as many intervals as possible, as is well known to those skilled in the piano tuning art.

If the tuning is not satisfactory, the technician readjusts (at 568) the Nth note. The phase difference is again calculated (at 570), and the phase difference is recalculated and the displays are updated almost instantly. Just as with the reference note, the calculations and recalculations of the phase difference and the beat rates are preferably fast enough that the adjustment (at 568), the viewing (at 576), the decision (at 578) whether to continue the adjusting the reference note, and repeat adjustments often will merge into one continuous act of the technician.

Various note sequences may be used in the tuning of the remaining Nth notes. Typically, the second note tuned by the technician is A3. This note is then followed by succeeding higher notes until the reference note is reached. With each note that is tuned, more partial matrices are measured and stored, and the ideal tuning frequencies re-calculated (at 564) become progressively more accurate. The technician will continue tuning the piano from the note following the reference note up to the top of the piano. This is followed by tuning the first note below the technician's preferred temperament octave and then tuning down to the bottom of the piano.

Measuring the exact frequencies of a note's partials is a difficult and error-prone task because the weaker partials will be masked by (a) the stronger partials (of greater amplitude) and (b) background noise and other sounds. The filtering process isolates the partial as best as possible. Even the filtering cannot solve yet another difficulty factor—the note is being tuned while it is being measured, and therefore the frequencies are not constant.

In an especially preferred embodiment of the system, the Frequency and Quality Discriminator 216 addresses these problems by calculating an average frequency and determining a quality factor. This quality factor is calculated by testing the variance of consecutive wavelength measurements. A higher variance indicates a weaker and therefore less accurate signal, or a changing frequency due to tuning.

The inharmonicity value generator 218 then uses the quality factor of several simultaneously measured partials to determine when pairs of partial compositely have the highest quality measurements, and it is these moments that heavily weight the calculation of the difference in the offsets of these partials.

These differences (Inharmonicity Values) do not change for a given tone generator, but the ability to accurately measure them does change. Therefore, when it is determined that a high quality measurement is being taken, this measurement should be used. Even while a string is being tuned, the differences should not change, because the whole tone generator is being tuned, and the partials will remain in relationship with each other.

In a preferred embodiment of the invention, an automatic locking mechanism prevents any unwanted recalculation of the tuning. This is helpful, for example, after tuning the entire musical instrument once, when the technician wants to go back and re-check some notes. If the tuning were unlocked, slight changes in the partial measurements may recalculate the tuning for this note slightly. This is generally acceptable to technicians when still performing the first tuning of the note, but when checking the note later, the technician generally does not want the target frequency to have changed from when the note was first tuned.

Various aspects of the invention will now be described in the sections that follow.

1. AUTOMATIC NOTE DETECTION

As discussed above and with reference to FIGS. 2 and 8–11, the system 100 preferably has a sub-system for automatically detecting the musical note corresponding to the tone generator being tuned. The automatic note detection function allows for hands-off operation, that is, it allows the.technician to tune a musical instrument without having to manually set the system 100 to the proper note before tuning each note. Generally, the note detection involves measuring a sound of a tone generator, determining two or more values each representative of a frequency of a partial of the tone generator, and analyzing the values in order to determine the identify of the sounded tone generator. In a particularly preferred embodiment, the note detection involves measuring a frequency spectrum of a tone generator of a musical instrument, and then analyzing the frequency spectrum to determine the identity of the tone generator and its corresponding note.

Figure 8:
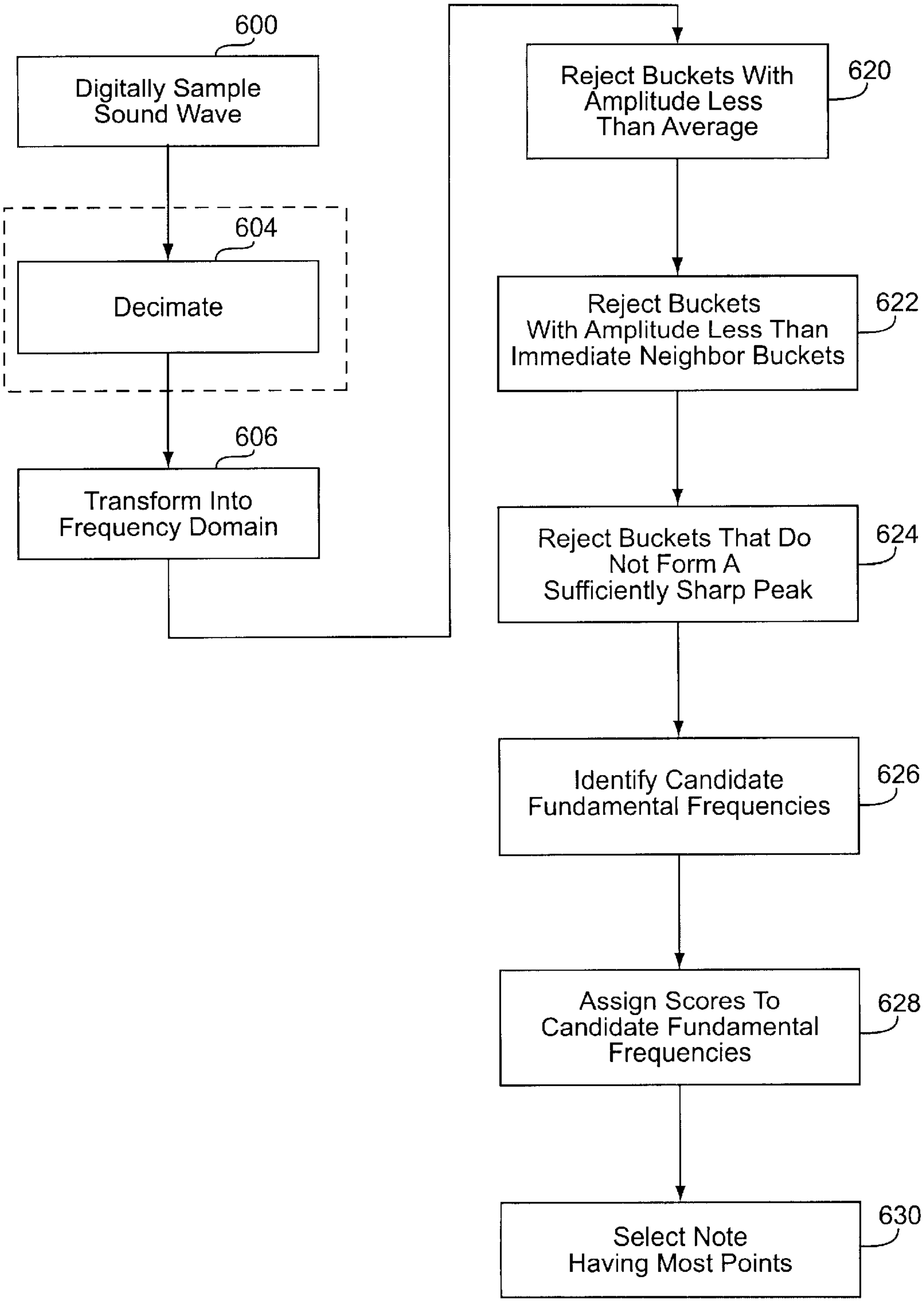
FIG. 8 is a flow diagram of a preferred embodiment of a method of detecting a note according to the present invention.

A preferred embodiment of a novel automatic note detection sub-system and method is shown in FIG. 8 as a flow diagram. The note detection begins with the digital sampling of a wave (at 600, as shown in FIG. 8) to produce a digital signal. The signal is then decimated by a sub-system of filters and decimators as shown in more detail in FIG. 9. The Fast Fourier Transforms FFT's divide the signal into discrete frequency ranges, referred to herein as discrete spectrum ranges or frequency "buckets."

Each bucket covers a linear frequency range in the FFT of exactly:

$$\omega = s/2^n$$

where ω is the frequency range of the bucket, s is the sample rate, and n is the order of the FFT. In the preferred embodiment, an FFT order of 10 is used. Then the frequency for a bucket number b is:

$$f = \omega b$$

Figure 9:
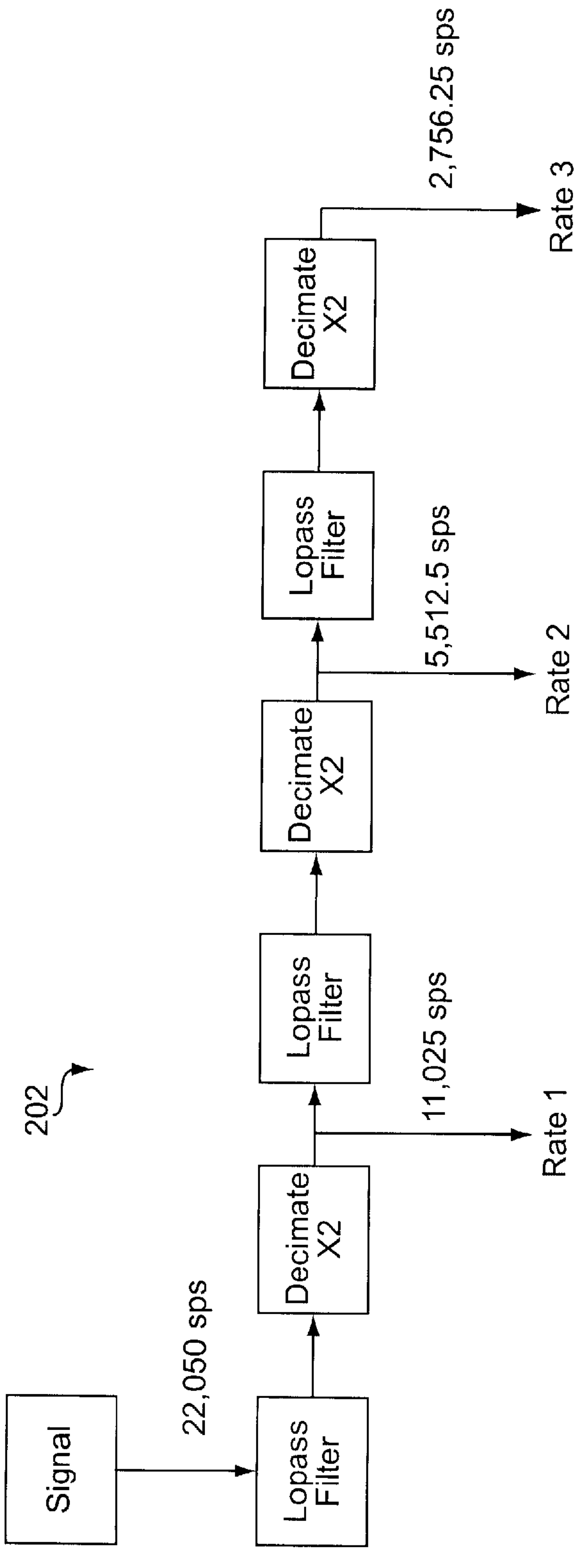
FIG. 9 is a schematic of a preferred embodiment of a decimation system for use in the method of FIGS. 8, 12, 16, 20 and 21.

An FFT results in buckets covering equal linear amounts of spectrum coverage. This does not match well with the musical scale which is logarithmic in nature. In the musical scale, the frequency doubles each octave, and the piano has more than seven octaves of frequency range. One FFT covering the entire piano range with sufficient resolution for the lower frequencies is typically too computationally intensive to be practical. Therefore, in a preferred embodiment of the invention, three separate FFT algorithms each using covering a different amount of total spectrum. Decimation is used to reduce the sampling rate for each of the FFT's, as shown in FIG. 9.

Figure 10:
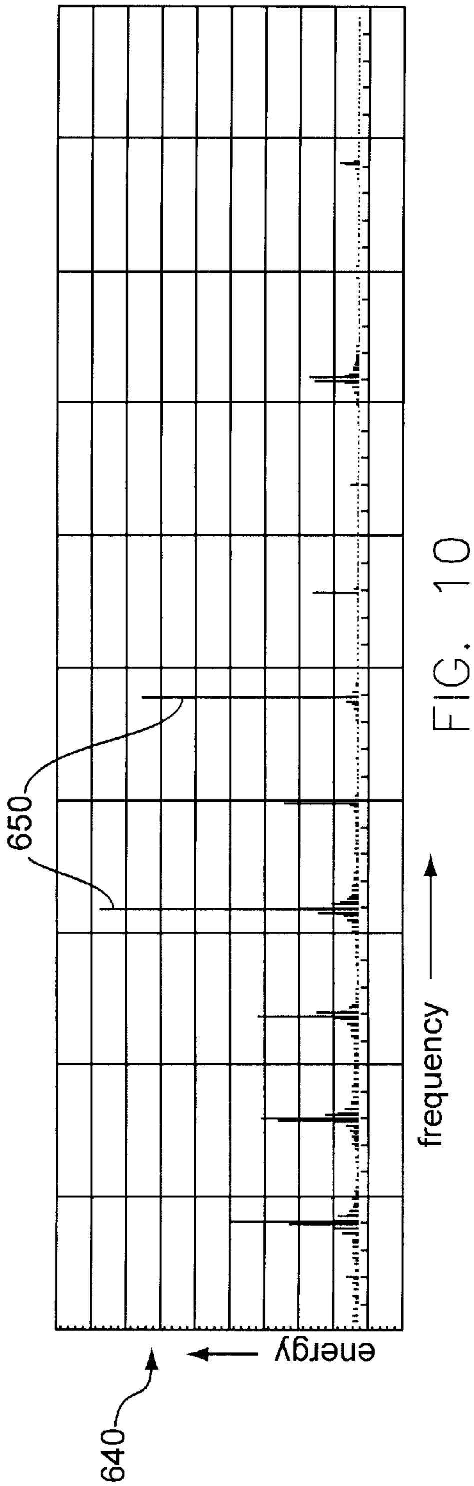
FIG. 10 is a plan view of a measured frequency spectrum for use in the method of FIG. 8.

The FFT's determine the energy content of each discrete frequency range or bucket. The result is a frequency spectrum as shown in FIG. 10. The amplitude of each discrete vertical line at each frequency bucket represents the amount of energy present in that bucket, that is, amount of energy present in various frequency bands from the note being sounded.

Each tone generator produces a series of partials at frequencies which are approximately integer multiples of their fundamental pitch. Partials contained in the sounding note will appear as local peaks in the spectrum. In order to distinguish the partials from the background noise, the system preferably uses a peak detection mechanism to find buckets which contain more energy than average and sufficiently more energy than its neighbors on either side, therefore indicating an actual peak in the spectrum rather than merely noise. Each bucket is examined to determine whether it contains a peak.

The determination of whether a bucket contains a peak representing a partial preferably involves three parts. First, if the amplitude of a selected bucket is less than the simple average of all buckets determined by the peak detector, then the bucket is rejected (at 620, as shown in FIG. 8) as a peak. Second, if the amplitude of either bucket immediately adjacent to the candidate bucket is larger than the amplitude of the selected bucket then the selected bucket is rejected (at 622) as a peak.

If the selected bucket survives the first two tests, in an especially preferred embodiment, a more rigorous test is applied to determine if a sufficiently sharp peak is formed by the bucket and its neighbors. A "span" is the number of neighbor buckets to be examined in each direction. In the preferred embodiment, the span includes three buckets in either direction. For each span bucket within the span, except for the bucket's immediate neighbors, a target amplitude $a_t$ is calculated as:

$$a_t = a_c * [(s-d)/(s-1)]$$

where $a_c$ is the amplitude of the selected bucket, s is the span size in number of buckets, and d is the distance (in number of buckets) from the span bucket to the candidate bucket where d>1. If the amplitude of the span bucket is in excess of the target amplitude, the excess is accumulated in the total excess amount according to the formula:

$$e_{new} = e_{old} + (a_s - a_t),\ \text{if}\ a_s > a_t$$

where $a_s$ is the amplitude of the span bucket. Once all buckets in the span have been examined, the total excess is compared against a percentage of the amplitude of the selected bucket. If the excess is greater, then the bucket is rejected (at 624) as a peak:

if e>m $a_c$, then reject bucket as a peak.

where m is an empirically determined sharpness factor. In the preferred embodiment, m is about 0.20 to about 0.30, and more preferably, about 0.25.

If at this point the bucket has not been rejected, then it is considered a peak. It is notable that this formula discriminates using the sharpness of the peak rather than its amplitude.

Figure 11:
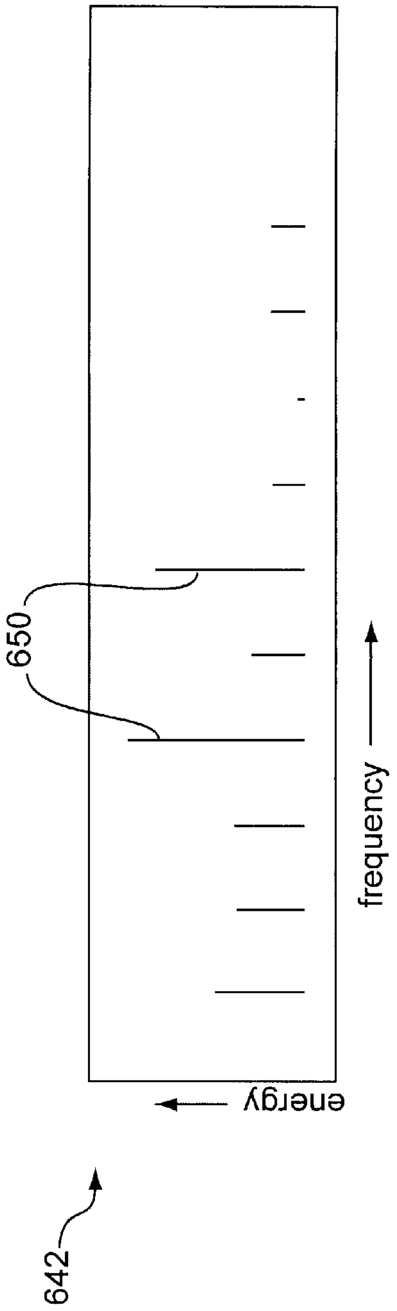
FIG. 11 is a plan view of partial frequencies isolated from the spectrum of FIG. 10 using the method of FIG. 8.

The selected peaks, shown in FIG. 11, are represented by their bucket number and amplitude, as shown in Table 1:

TABLE 1

Example of Peaks for Note A2 on a Yamaha U1 piano

| Bucket # (Hz) | Amplitude |
|---|---|
| 41 | 16419 |
| 82 | 12487 |
| 122 | 12676 |

TABLE 1-continued

Example of Peaks for Note A2 on a Yamaha U1 piano

| Bucket # (Hz) | Amplitude |
|---|---|
| 163 | 32767 |
| 204 | 9571 |
| 245 | 27596 |
| 286 | 5858 |
| 327 | 1129 |
| 369 | 6301 |
| 410 | 6233 |

The system then performs a search to determine the most probable fundamental frequency or fundamental pitch of the sounding note. The search includes fundamental frequencies suggested by strongest peaks found. At least one of, and preferably, each of the strongest peaks is used to identify various candidate fundamental frequencies wherein the peak represents various possible partials of that fundamental frequency. Then each of the identified candidate fundamental frequencies is scored to determine which is the most consistent with the spectrum of the sounding note.

In the example shown in Table 1, the strongest peak is at bucket #163. Since it is known that partials will create peaks at frequencies that are integral multiples of the fundamental, various additional candidate fundamental frequencies can be identified which, if they were the true fundamental frequency of the note being sounded, would contain a partial at bucket #163, corresponding to 163 Hz. This is done by dividing 163 by its various possible partial numbers. The candidate fundamental pitch, 163 Hz, is therefore divided by one or more integer multiples, and resulting in one or more quotients. At least one of, and preferably all of, these quotients are separately identified as candidate fundamental frequencies. All frequencies are represented by their bucket numbers, as shown in Table 2. Note that in this table, frequencies are listed in terms of bucket numbers. Although a bucket number typically will be expressed as an integer, all intermediate values in the system are preferably calculated with fractional parts in order to avoid compounding of rounding errors.

TABLE 2

Example of Candidate Fundamental Frequencies

| Scenario | Fundamental Frequency |
|---|---|
| 163 is partial #1 | 163.00 |
| 163 is partial #2 | 81.50 |
| 163 is partial #3 | 54.33 |
| 163 is partial #4 | 40.75 |
| 163 is partial #5 | 32.60 |
| 163 is partial #6 | 27.17 |
| 163 is partial #7 | 23.29 |
| 163 is partial #8 | 20.38 |
| 163 is partial #9 | 18.11 |
| 163 is partial #10 | 16.30 |
| 163 is partial #11 | 14.82 |
| 163 is partial #12 | 13.58 |

The candidate fundamental frequencies generated are preferably limited to those whose partials would be practical to distinguish within the resolution of the FFT. The smallest spacing of partial peaks that can be identified within an FFT has been empirically identified as about 5. Accordingly, in the example above in Table 2, all twelve possibilities for the partial corresponding to 163 are candidates (note that partial #12 is equal to 13.58 which is greater than about 5). The candidate partial numbers examined are also limited to those which represent partials that are typically strongly generated on a piano, which has been empirically identified as about 12.

Next, in the preferred embodiment, the second strongest peak is used to identify additional candidate fundamental frequencies in the same way. This process is repeated for as many strongest peaks as is allowed within the computation time constraints of the system. Typically, examining the 4 strongest peaks identifies a sufficient number of candidate fundamental frequencies to ensure that the correct frequency is identified, however, more or fewer peaks may be examined based upon time considerations.

Next all of the identified candidate fundamental frequencies are scored to determine their likelihood of representing the true fundamental frequency of the note being sounded. In the preferred embodiment, this is done by measuring the difference in energy between buckets where a partial is expected and where a partial is not expected.

First, boundaries are set up to create ranges around the buckets which are integral multiples of the candidate fundamental frequency, the buckets where each partial is expected to be present. In the preferred embodiment, the boundaries extend about 10% to abut 40% of the candidate fundamental frequency, and more preferably, extend about 25% of the candidate fundamental frequency above and below the partials. In the above example, if the candidate fundamental frequency of 40.75 were scored, 25% of 40.75 is 10.1875, and so the upper boundary for the detection of partial #1 would be 50.9375 and the lower boundary would be 30.5625. The calculated boundaries are preferably then rounded to the nearest integral bucket number to establish the actual boundaries used in the scoring. In the above example, boundaries would be set up as shown in Table 3:

TABLE 3

Example of partial boundaries

| Partial | Bucket # | Calculated Lower Boundary | Rounded Lower Boundary | Calculated Upper Boundary | Rounded Upper Boundary |
|---|---|---|---|---|---|
| 1 | 40.75 | 30.5625 | 31 | 50.9375 | 51 |
| 2 | 81.50 | 71.3125 | 71 | 91.6875 | 92 |
| 3 | 122.25 | 112.0625 | 112 | 132.4375 | 132 |
| 4 | 163.00 | 152.8125 | 153 | 173.1875 | 173 |
| 5 | 203.75 | 193.5625 | 194 | 213.9375 | 214 |
| 6 | 244.50 | 234.3125 | 234 | 254.6875 | 255 |
| 7 | 285.25 | 275.0625 | 275 | 295.4375 | 295 |
| 8 | 326.00 | 315.8125 | 316 | 336.1875 | 336 |
| 9 | 366.75 | 356.5625 | 357 | 376.9375 | 377 |
| 10 | 407.50 | 397.3125 | 397 | 417.6875 | 418 |
| 11 | 448.25 | 438.0625 | 438 | 458.4375 | 458 |
| 12 | 489.00 | 478.8125 | 479 | 499.1875 | 499 |

Next, further boundaries are established for the range of buckets between each of the partial ranges. Then for each of the intra-partial ranges and inter-partial ranges, peak values are determined by finding the highest value contained within the range. In the example spectrum for A2 above, peaks values will be found as shown in Table 4:

TABLE 4

Example of measured peak values

| Range | Lower Boundary | Upper Boundary | Peak Value |
|---|---|---|---|
| Within Partial 1 | 31 | 51 | 16419 |
| Between Partial 1 and 2 | 61 | 70 | 4000 |
| Within Partial 2 | 71 | 92 | 12487 |
| Between Partial 2 and 3 | 93 | 111 | 3500 |
| Within Partial 3 | 112 | 132 | 12676 |
| Between Partial 3 and 4 | 133 | 152 | 9000 |
| Within Partial 4 | 153 | 173 | 32767 |
| Between Partial 4 and 5 | 174 | 193 | 15000 |
| Within Partial 5 | 194 | 214 | 9571 |
| Between Partial 5 and 6 | 215 | 233 | 15000 |
| Within Partial 6 | 234 | 255 | 27596 |
| Between Partial 6 and 7 | 256 | 274 | 8000 |
| Within Partial 7 | 275 | 295 | 5858 |
| Between Partial 7 and 8 | 296 | 315 | 2000 |
| Within Partial 8 | 316 | 336 | 1129 |
| Between Partial 8 and 9 | 337 | 356 | 2000 |
| Within Partial 9 | 357 | 377 | 6301 |
| Between Partial 9 and 10 | 378 | 396 | 4000 |
| Within Partial 10 | 397 | 418 | 6233 |
| Between Partial 10 and 11 | 419 | 437 | 200 |
| Within Partial 11 | 438 | 458 | 500 |
| Between Partial 11 and 12 | 459 | 478 | 100 |
| Within Partial 12 | 479 | 499 | 200 |

Next, in the preferred embodiment, the score is calculated by subtracting the sum of the inter-partial peaks from the sum of the intra-partial peaks. Higher scores identify candidate fundamental frequencies which are more consistent with the spectrum of the sounding note, that is, those which have a pattern of more energy at the frequencies where partials are expected and less energy where they are not expected.

Finally, the highest scoring candidate fundamental frequency is chosen, and its bucket number is converted into a frequency.

The automatic note detection process is repeated for each frame of the digital signal of the sounding note. A typical frame length, by way of example only, is about 1/100 to about 1/5 of a second, and more preferably, about 1/20 of a second. When the automatic note detection process over a certain number of consecutive frames, preferably three, selects the same fundamental pitch, then the note should be considered detected. Detecting on only one frame may result in the detection of incorrect pitches due to the limited analysis of only a small portion of the sustained sound.

The note detection sub-system may be used with other sub-systems described herein. In the preferred embodiment, the note detection is used during a "hands-off" tuning of a musical instrument. For example, after the note detector identifies a particular tone generator, any information available about that note, such as a calculated tuning, an estimated tuning frequency, or a pre-stored data, may be displayed by the system and used by a technician to tune the identified tone generator.

2. DETERMINATION OF A DIGITAL WAVELENGTH

As discussed above and with reference to FIGS. 2 and 12, the system 100 preferably has a sub-system for determination of a wavelength of a digitally sampled wave. The system 100 may use any conventional process for determining a wavelength, however, the operation of a preferred embodiment and novel wavelength calculator 212 is shown by a flow diagram in FIG. 12.

Figure 12:
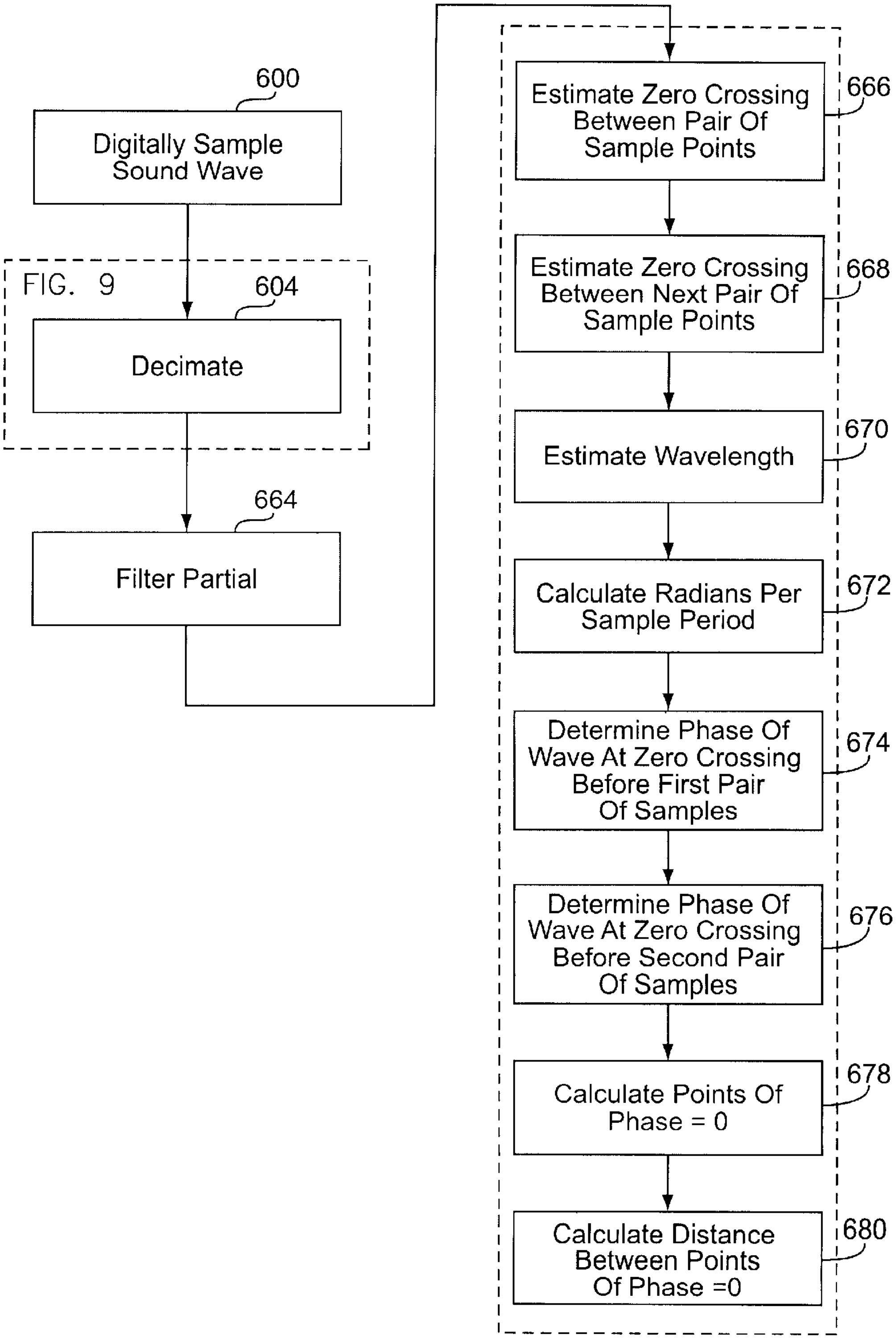
FIG. 12 is a flow diagram of a preferred embodiment of a method for determining a wavelength of a digitally sampled wave according to the present invention.

The wavelength calculator 212 receives a signal representing a digitally sampled sound wave (at 600, as shown in FIG. 12) that has undergone decimation (at 604) and filtering (at 664) to isolate signals representing the individual partials of sound wave. In the preferred embodiment, the wavelength calculator models the signal by the formula y=a sin(ωt). Because the signal is deterministic, the value y can be determined at any time t. Also, the time t for a particular value y can be determined. The latter is needed to determine a zero crossing point.

Figure 13:
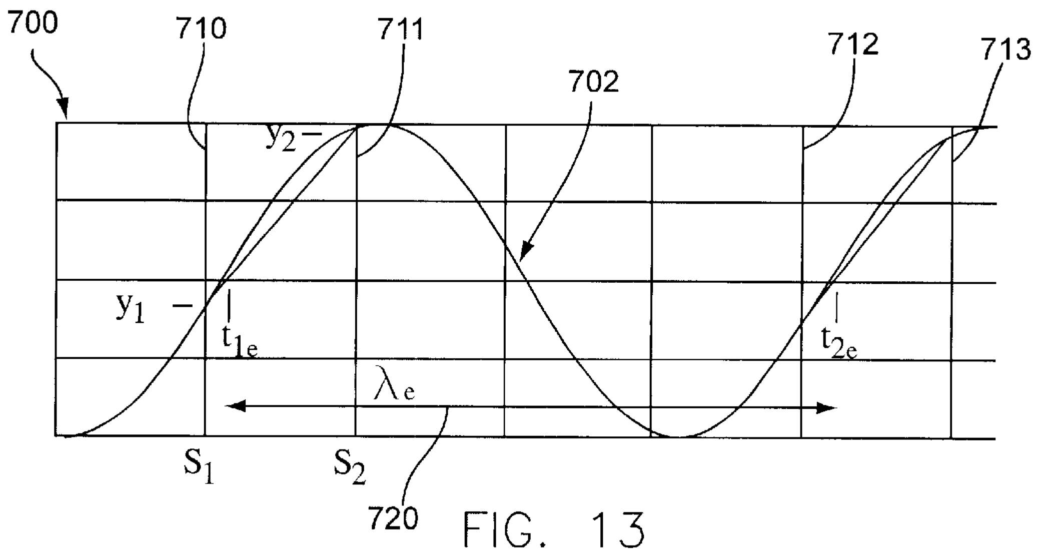
FIG. 13 is a plan view of a graph illustrating the method of FIG. 12.

FIG. 13 illustrates a digitally sampled sine wave 702. The vertical lines 710–713 represent sampling points. Using linear interpolation, a zero crossing point $t_e$ which is between the samples $s_1$ and $s_2$ can be estimated (at 666, as shown in FIG. 12). Using standard equations for a line on an x,y-axis (e.g. y=mx+b where m is the slope of the line, and b is the y-intercept), and setting the endpoints at $y_1$ and $y_2$ and solving for t where y=0 yields:

$$t_e=s_1-y_1/(y_2-y_1)$$

This process is then repeated (at 670) at the next zero crossing point after exactly one cycle of the sine wave has advanced. Then the difference between the two zero crossing points becomes the estimated wavelength 720:

$$\lambda_e=t_{2e}-t_{1e}$$

As can be seen from FIG. 13, the actual zero crossing point of the sine wave does not correspond exactly with the one that was estimated by linear interpolation. Instead of using the equation of a line to estimate the time t, because the exact nature of the signal is known (it is a sine wave) it is appropriate to use the equation of a sine wave, namely y=a sin(ωt), as the basis for the estimation.

Now that the wavelength has been estimated (at 670), the number of radians the sine wave progresses through one sample period can be calculated (at 672) by the formula:

$$\rho=2\pi/\lambda_e$$

Now $y_1$ and $y_2$ can be expressed as functions of the phase θ of the sine wave as:

$$y_1=a\sin(\omega\theta_1)$$

$$y_2=a\sin(\omega(\theta_1+\rho))$$

where $\theta_1$ is the phase of the sine wave at time $s_1$ and $(\theta_1+\rho)$ is the phase of the sine wave at time $s_2$. By determining $\theta_1$, the location of the sample points $s_1$ and $s_2$ in comparison to the phase of the sine wave can also be determined. Combining the pair of equations with y=a sin(ωt) and solving for θ with the conditions that $$-\pi/2<\theta_1<0 \text{ and } 0<\rho<\pi/2$$

yields:

$$\theta_1=-\tan^{-1}[\sin(\rho)/((y_2/y_1)-\sin(\rho-\pi/2))]$$

Given the sine wave equation y=A sin ωθ, the zero cross point will occur at the point where θ=0. This point $t_z$ can now be determined (at 678) as time s, plus a fraction of ρ by:

$$t_z=t_1+(-\theta_1/\rho)$$

This process is then repeated at the next zero crossing point. Then the difference between the two zero crossing points is calculated (at 680) the calculated wavelength.

$$\lambda=t_2-t_1$$

3. MEASUREMENT OF A CHANGING FREQUENCY

As discussed above and with reference to FIGS. 2 and 14–15, the system 100 preferably has a sub-system for determining an average frequency and discriminating frequency signals of high quality from those of low quality. The system 100 may use any conventional process for measuring a frequency, however, the operation of a preferred embodiment and novel frequency quality discriminator 216 is shown by a flow diagram in FIG. 14.

Figure 15:
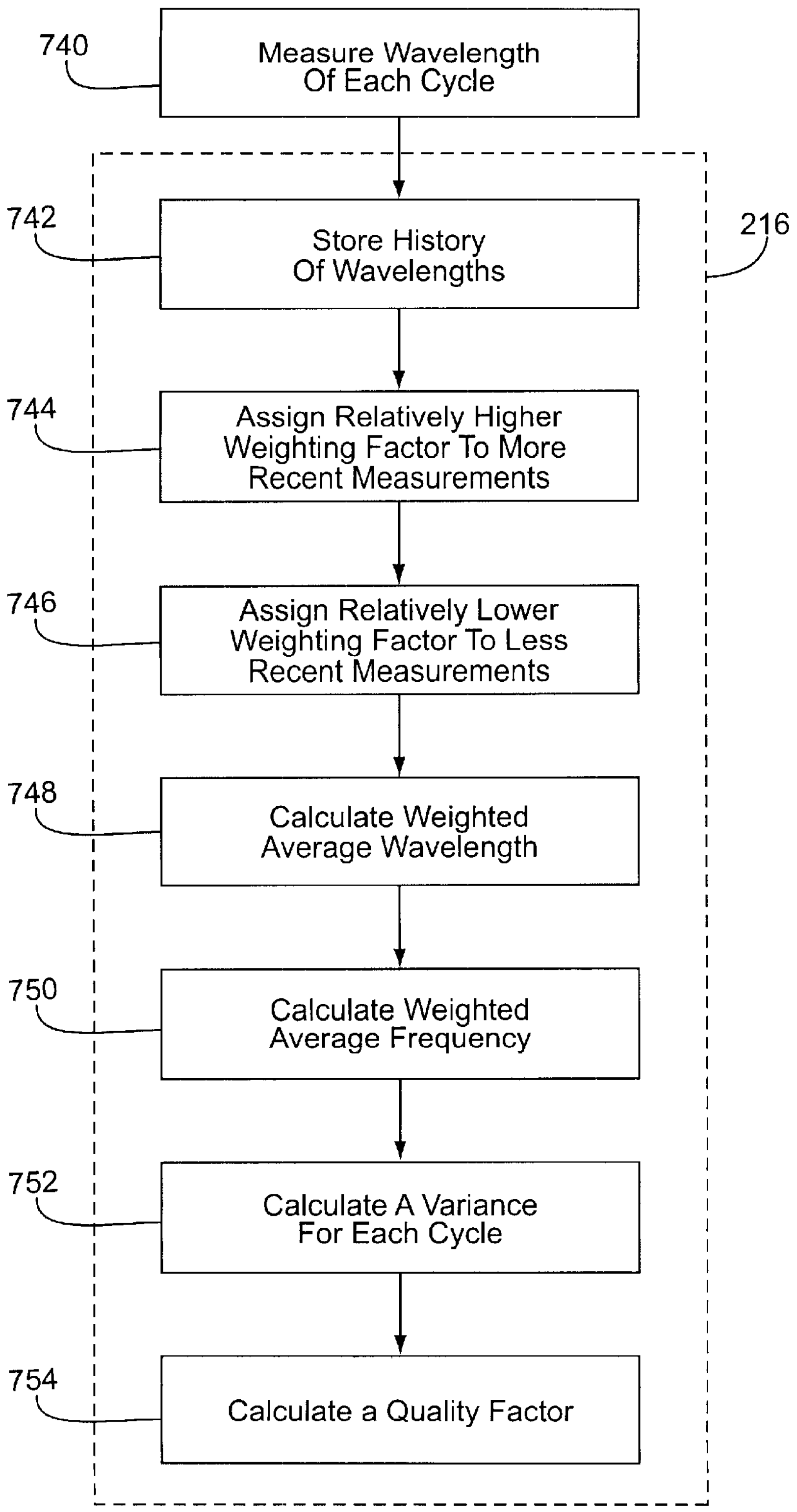
FIG. 15 is a flow diagram of a preferred embodiment of a method for measurement of a changing frequency according to the present invention.

In a preferred embodiment of the invention, the frequency and quality discriminator 216 uses a history of wavelengths to determine a rolling average frequency and a quality factor. The history contains the measured wavelengths within a short prior duration of time (by way of example only, a time period of about 150 ms). Since each wavelength measurement in itself will contain a margin of error due to noise, sampling roundoff, and intermediate value roundoff, a more accurate wavelength measurement may be made by averaging several consecutive wavelengths. However, since the frequency may change over time, this window must be kept short enough to be able to track a changing frequency. To provide further responsiveness to the change over time, a weighting is used for each value where the most recent values are weighted more so than the previous. An example of such a weighting factor is determined by a formula $$W_i=1 \text{ where } i<h/2$$

$$W_i=(h-i)/(h/2) \text{ where } i]h/2$$

where W(i) is a weighting factor, h is the size of the history, and i is the number of past history elements at the current time. This produces a weighting graph as shown in FIG. 15. The calculation of the current wavelength value is performed after each cycle of the signal. Thus the history window slides by one cycle for each calculation.

The average wavelength may then be calculated by the formula:

$$\lambda_m=\Sigma[W_i\lambda_i]/\Sigma W_i$$

where $W_i$ is a weighing factor, $\lambda_i$ is a wavelength at a specified time, and i is the history element index.

In addition to calculating the average wavelength, it is useful to estimate how accurate the estimate may be by calculating a quality factor. The quality factor represents the certainty of the measurement by determining the consistency of recent measurements. It is calculated by considering the variances of each measurement from the weighted average. Each variance is preferably determined by calculating the difference between the measurement and the average, in consideration of a deadband:

$$\Delta_i=\lambda_i/\lambda_m-1-d, \text{ when } \lambda_i]\lambda_m \text{ and } \lambda_i/\lambda_m-1>d;$$

$$\Delta_i=\lambda_m/\lambda_i-1-d, \text{ when } \lambda_i<\lambda_m \text{ and } \lambda_m/\lambda_i-1>d;$$

$$\Delta_i=0, \text{ elsewhere}$$

where λ(i) is a wavelength from the wavelength history, $\lambda_m$ is the prior average wavelength, and d is the deadband that specifies a lower boundary variance for which any lower variance will be ignored. This deadband value is preferably set as the amount of variance that the system will find when a perfect sine wave is presented at maximum amplitude. The small variances in this scenario are due to roundoff not caused by the signal itself, and should be ignored. In the preferred embodiment, d is about $8\times10^{-6}$ to about $8\times10^{-5}$.

Each variance is then used to calculate a quality factor on the scale of 0 to 100 by:

$$F=\Sigma[W_ic/(1+a\Delta(i))]/\Sigma W_i$$

where a is a sensitivity factor used to adjust how the much the score is reduced from 100 when variances are introduced, and c is a constant. This formula sets up a scoring range of 0 to 100, where 100 indicates no variance at all, and zero indicates an infinite amount of variance. In the preferred embodiment, a is about 1000 to about 20,000. It should be appreciated by those skilled in the art that other equations could be used that apply these principles.

The method should consider all the measurements in the window even at the start of a signal when the window has not been filled. This gives the desired effect of a low score at the start of a signal, when not enough of the signal has been analyzed to merit a high score.

4. CONSTRUCTION OF AN INHARMONICITY VALUE MATRIX

As discussed above and with reference to FIGS. 2 and 16, the system 100 preferably has a system for generating a inharmonicity value matrix containing mathematical relationships, referred to herein as inharmonicity values, between unique pairs of partials for each tone generator. The operation of the inharmonicity value matrix generator 218 is shown by a flow diagram in FIG. 16.

The inharmonicity value generator produces a inharmonicity value matrix including individually measured differences in frequencies between each unique pair of partials, as shown below in Table 5:

TABLE 5

Example of a Inharmonicity Value Matrix Having Six Partials

| | 1 | 2 | 3 | 4 | 5 | 6 |
|---|---|---|---|---|---|---|
| 1 | | 0.1 | 0.3 | 0.5 | 0.8 | 1.2 |
| 2 | | | 0.2 | 0.3 | 0.7 | 1.1 |
| 3 | | | | 0.2 | 0.5 | 0.9 |
| 4 | | | | | 0.3 | 0.7 |
| 5 | | | | | | 0.4 |
| 6 | | | | | | |

As used herein, the notation 1→2(0.1) refers to an inharmonicity value of 0.1 cents for the relationship between the first partial and the second partial frequency of a tone generator.

During the measurement process, the frequencies of several partials, and preferably, substantially all partials, are regularly measured to determine the respective partial's offset, which is the amount it deviates from its theoretical harmonic value (exact integer multiple of the note's expected fundamental frequency). The unit for this offset measurement is usually cents, which is equal to 1/100 of the difference between consecutive semitones of the musical scale, or 1/1200 of an octave. Cents deviations c between two frequencies are usually calculated by the formula $$c=1200*\log_e(f2/f1)/\log_e(2)$$

where f2 and f1 are the frequencies being compared.

Then for each unique combination of two partials, the difference in these offsets y is calculated by $$y=c_2-c_1$$

where $c_1$ is the offset of the first partial, and $c_2$ is the offset of the second partial The inharmonicity value is then placed into the corresponding cell of the matrix. Each possible combination is used only once, e.g. a 4→5 relationship would be redundant with a 5→4 relationship. The partial need not be related with itself, because this would result in a zero difference.

Figure 17:
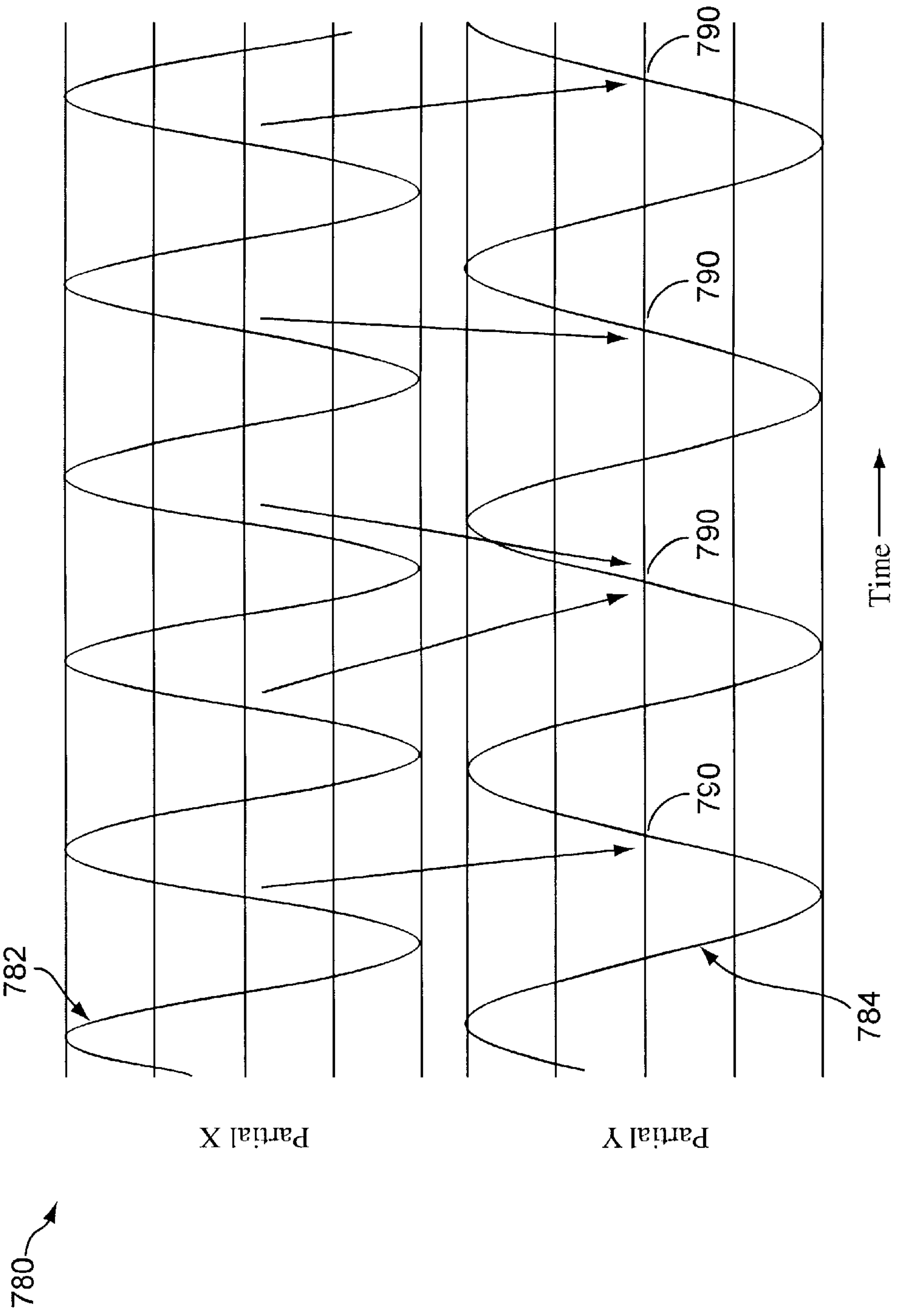
FIG. 17 is a plan view of a graph illustrating a portion of the method of FIG. 16.

In the preferred embodiment, an instantaneous frequency and instantaneous quality factor for each partial is measured over the time that the note is sounding, as described in detail above in the section entitled "Measurement of a Changing Frequency." As shown in FIG. 17, such measurements from each unique pairing of partials are then combined at each zero crossing of the partial having the higher frequency, and each measurement of the higher partial is matched with the measurement of the lower partial occurring closest in time.

For each pair of matching measurements, the offsets are subtracted yielding a difference. The quality factors of these two partials are combined to produce a composite quality factor. In the preferred embodiment, to combine the quality factors of two partials, two 0–100 range quality factors are multiplied together and then divided by 100:

$$F_c=(F_1*F_2)/100$$

This has the desirable effect of producing a very low score if either of the scores is very low, and a high score when both have high scores. For example, $F_1=5$, $F_2=95$, yields a relatively low composite factor, $F_c=4.75$. However, $F_1=95$, $F_2=95$, yields a relatively high composite quality factor $F_c=90.25$ The differences are preferably weighted by the composite quality factor to produce a weighted average over the duration of the note. The composite quality factor heavily weights the moments when these two partials are both most stable.

Because each relationship in the inharmonicity value matrix essentially represents a difference in frequency between one partial and another, the sum of the inharmonicity values of two consecutive relationships (relationships which share a common partial) will generally add up to the inharmonicity value of the extended relationship between the outside partials of these relationships, for example:

$$2\rightarrow3+3\rightarrow4\approx2\rightarrow4$$

However, because each relationship is independently measured and calculated based on the interaction of its two partials, the inharmonicity values of these consecutive relationships may or may not exactly add up to the inharmonicity value of the extended relationship. By directly producing an inharmonicity value for each permutation of partials, more accurate inharmonicity values are provided as input to the calculation of ideal tuning frequencies than can be provided by prior means.

5. CALCULATION OF IDEAL TUNING FREQUENCIES

As discussed above and with reference to FIGS. 2, 18 and 19, the system 100 preferably has a sub-system for calculating ideal tuning frequencies. In the preferred embodiment, as previously described with reference to in FIG. 7, ideal tuning frequencies are first calculated after measurement of the reference note and then recalculated after measurement of each succeeding note (at 510, and 564 respectively, as shown in FIG. 7).

Figure 18:
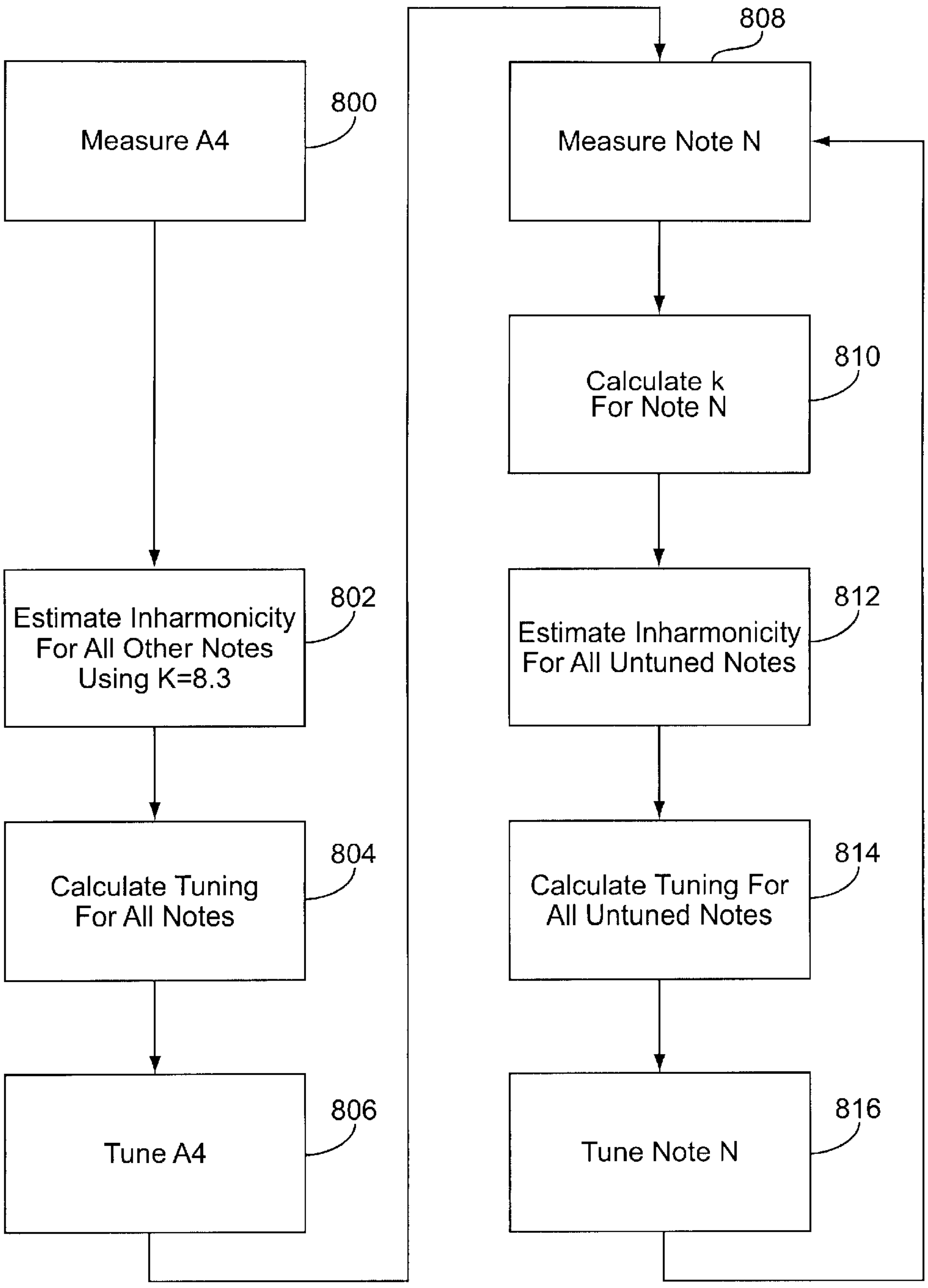
FIG. 18 is a flow diagram of a preferred embodiment of a method for single pass tuning of an instrument according to a preferred embodiment of the invention.

FIG. 18 illustrates a process for single pass tuning of a piano according to a preferred embodiment of the invention. First, a inharmonicity value matrix is measured (at 800, as shown in FIG. 18) for the reference note, preferably A4, as described in Section 4 above entitled "Construction of a Inharmonicity Value Matrix". Next, the estimated inharmonicity values for each remaining tone generator are calculated (at 802) and stored in an inharmonicity table, as discussed in detail below in subpart B entitled "Calculation of Estimated Inharmonicity Values." When only the first note has been measured, a default k value such as 8.3 is used. After the estimated inharmonicity values are calculated, the ideal tuning frequencies are calculated (at 804), as discussed in detail below in subpart C entitled "Ideal Frequencies." The target frequency of the first partial of the reference note is set to the standard pitch, preferably 440 Hz or another standard pitch selected by the technician. The technician adjusts the tone generator (at 806) until its tuning substantially coincides with the target frequency.

After the tuning of the reference note is complete, the technician energizes the tone generator corresponding to the second note. A inharmonicity value matrix is then measured (at 808) for the second note. The system then calculates (at 810) k values for the second note as discussed below in subsection A "Calculation of k values". In the preferred embodiment, estimated inharmonicity values for each remaining unmeasured tone generator are then calculated (at 812) as discussed below in subsection B. The system then calculates (at 814) the ideal tuning frequencies as discussed below in subsection C. The technician adjusts (at 816) the second tone generator until its tuning is satisfactory. Then the process is repeated for all remaining notes.

In the preferred embodiment, multiple inharmonicity values for each of substantially all tone generators for are either calculated or estimated. However, in alternate embodiments which may provide faster calculation times and less rigorous electronic equipment, only one inharmonicity value for each of a plurality of tone generators need be calculated and/or estimated.

The calculation of tuning frequencies according to the present invention allow for "single pass" tuning wherein each of tone generators of an instrument is adjusted to a final state before another tone generator is measured, and no other tone generators are measured before said first tone generator.

The details of the calculations are now described below with reference to subparts A–C.

A. Calculation of k Values

As each note is being adjusted by the technician, its inharmonicity is simultaneously being analyzed according to the method described in "Construction of a Inharmonicity Value Matrix." Assuming that the tuning is not locked, the inharmonicity of each partial is measured and stored (at 506 as shown in FIG. 7).

A k value will now be calculated for this note which represents the slope of the inharmonicity of the piano at this note in reference to the reference note $N_0$. k values are preferably calculated for all notes except for the reference note $N_0$, because when only the reference note has been tuned, the system 100 has measured only the inharmonicity of one note and a slope cannot be determined. If only the reference note has been measured, a default value of k=8.3 is used. It is known that the inharmonicity for each partial p across the piano generally follows the relation:

$$Y(N,p)=Y(N_0,p)*2^{(N-N0)/k}$$

where N is note C3 or higher where $Y(N_0,p)$ is the measured inharmonicity of each partial p of the reference note $N_0$ (preferably A4) and k is a doubling constant. Now solving for k yields $$k(N,p)=\log_e(2)/(\log_e(Y(N,p)/Y(N_0,p))/(N-N_0)),$$

where N is a note higher than $N_0$, and $$k(N,p)=\log_e(2)/(\log_e(Y(N_0,p)/Y(N,p))/(N_0-N)),$$

where N is a note lower than $N_0$ where N is the note being measured, and $N_0$ is the reference note. This doubling constant k(N,p) represents the slope of one partial of the inharmonicity of the measured note in reference to the same partial of the reference note $N_0$. Finally, the composite k value is calculate for the note N as an average by $$k(N)=[\Sigma k(N,p)]/n$$

where n is the number of k(N,p) values calculated.

B. Calculation of Estimated Inharmonicity Values

For each note N, estimated inharmonicity values are calculated based on the previously calculated k(N) values. The inharmonicity values are preferably estimated by the formula:

$$Y(N,p)=Y(N_0,p)*2^{(N-N0))/ka}$$

where $k_a$ is an average k value calculated from the nearest notes surrounding N for which inharmonicity values have been measured and k(N) values have been calculated. Included in this average are up to a maximum number of measured notes both above and below the note N, preferably up to 5 notes.

Notes which have not been measured are not used in this average calculation. If no notes whatsoever besides the reference note have been measured, then a preferred value of 8.3 is used as a default for $k_a$. Typically, the k values across the range of the piano will be substantially similar because k measures a slope which should be nearly the same at any point it is measured. By applying a simple average of surrounding k values, any trend of an increase or decrease in k values will be suitably reflected in a smooth progression of estimated inharmonicity values.

C. Ideal Frequencies

The goal is to produce an ideal tuning that preferably has (a) the reference note set to a reference frequency, (b) appropriate octave stretch, and (c) smoothly progressing interval widths. The inputs to this process are (i) the estimated inharmonicity values of each note as defined by a inharmonicity value matrix and k values for each note, and (ii) the technician's preferences.

The estimated inharmonicity table as calculated in subsection B above takes the general form shown in Table 6:

TABLE 6

Example of an Estimated Inharmonicity Table

| | 1 → 2 | 1 → 4 | 2 → 4 | 3 → 4 | 3 → 6 | . . . |
|---|---|---|---|---|---|---|
| . . . | | | | | | |
| A3 | 0.55 | 2.75 | 2.20 | 1.28 | 4.95 | |
| A#3 | 0.59 | 2.99 | 2.39 | 1.39 | 5.38 | |
| B3 | 0.65 | 3.25 | 2.60 | 1.51 | 5.85 | |
| C4 | 0.70 | 3.53 | 2.82 | 1.65 | 6.36 | |
| . . . | | | | | | |

Each cell contains the measured or estimated difference in cents between the offsets of the two partials listed in its column heading. The definitions of these values are described more fully in Section 4 above entitled "Construction of an Inharmonicity Value Matrix". As illustrated in the following Table 7, the output of the calculation that follows is, for each note and partial, the desired offset in cents from the partial's theoretical harmonic frequency.

TABLE 7

Example of Calculated Tuning Frequencies.

| | 1 | 2 | 3 | 4 | . . . |
|---|---|---|---|---|---|
| . . . | | | | | |
| F#4 | −0.66 | 0.51 | 2.45 | 5.18 | |
| G4 | −0.46 | 0.81 | 2.93 | 5.89 | |
| G#4 | −0.24 | 1.14 | 3.44 | 6.66 | |
| A4 | 0.00 | 1.50 | 4.00 | 7.50 | |
| . . . | | | | | |

The following demonstrates how data such as the estimated inharmonicity values shown in Table 6 are preferably analyzed to produce the ideal tuning frequencies shown in Table 7.

i—Set Reference Frequency

Figure 19:
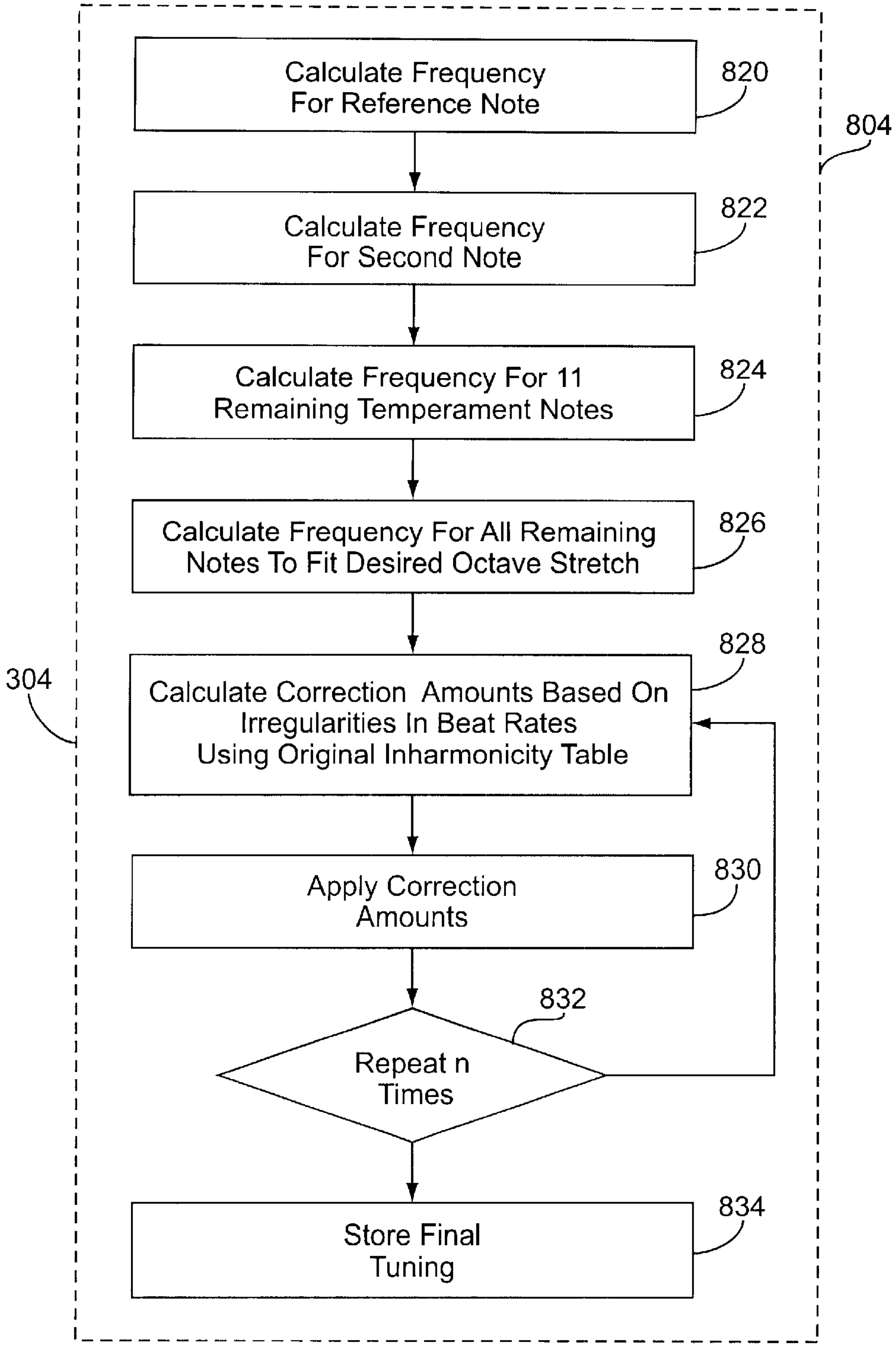
FIG. 19 is a flow diagram of a preferred embodiment of a method for calculating an ideal tuning according to the present invention.

The first partial of the reference note $N_0$, preferably A4, is set (at 820, as shown in FIG. 19) to the reference frequency (usually 440 Hz). This is represented by a zero offset=from the theoretical harmonic frequency of this partial.

ii—Calculate Temperament Octave Note

As used herein, a superscript indicates a particular partial of a note. For instance, $A4^2$ indicates the second partial of A4, and $A2^4$ indicates the fourth partial of A2. Furthermore, a superscript in parenthesis indicates a value from the inharmonicity table as identified by two numbers and an arrow. For instance, $A3^{(3\rightarrow 6)}$ indicates the difference in the offsets of the third and sixth partials of A3, which is the value 4.95 in the above example inharmonicity table (Table 6).

A note an octave away from the reference note is selected to be the temperament octave note, prefereably A3. The tuning for this note is preferably calculated (at 822) such that the octave has the desired width. Usual aural tuning techniques set this octave to be a slightly wide 4:2 octave, meaning that:

$$A4^2 > A3^4, \text{ and}$$

$$A3^4 = A4^2 - s$$

where s is the amount of extra stretch in cents beyond a pure 4:2 octave. Typically, s is about 0.67 cents. $A4^2$ is calculated using the inharmonicity table from the known $A4^1$ by $$A4^2 = A4^1 + A4^{(1\rightarrow 2)}$$

giving:

$$A3^4 = A4^1 + A4^{(1\rightarrow 2)} - s$$

Where $A4^1$ is known from subpart i "Set reference frequency" above.

iii—Calculate Temperament Notes

Preferably, next all the notes within the temperament octave are calculated (at 824). These notes may be used as a basis to calculate the remaining notes on the piano. If the technician desires Equal Temperament, then the goal is to have smoothly progressing intervals within this octave. This can be best achieved by setting the frequencies as offsets that grow exponentially according the slope of the inharmonicity in the temperament octave.

The slope m of the inharmonicity of the temperament can be calculated using the inharmonicity of one partial, such as 1→4, from each end of the temperament octave:

$$m = A4^{(1\rightarrow 4)} / A3^{(1\rightarrow 4)}$$

Then a temperament doubling constant $k_1$ is calculated which indicates over how many notes the inharmonicity doubles:

$$k_t = \log_e(2) / (\log_e(m)/12)$$

Frequency growth factors for each note are then calculated by:

$$G(N) = 2^{N/kt}$$

where G(N) is the growth factor for the Nth note, N is the note number within the temperament octave starting with N=0 for A3, and N=11 for G#4.

Within the octave, in order to produce a smooth tuning, the range of offsets for a certain partial, such as 4, must vary smoothly through its range from $A3^4$ to $A4^4$. $A3^4$ was previously calculated, and $A4^4$ is given by:

$$A4^4 = A4^1 + A4^{(1\rightarrow 4)}$$

The step value for each note is then calculated over the range $A3^4$ to $A4^4$ as a portion of the sum of growth factors by:

$$\Delta(N) = (G(N)/\Sigma G) * (A4^4 - A3^4)$$

Finally the fourth partial of each note within this range is calculated as a step above the previous by:

$$T(N) = T(N-1) + \Delta(N)$$

where $T(0) = A3^4$

In an alternate embodiment of the calculation, various non-equal temperaments may be desired for the purposes of playing music using the temperaments that were likely in use at the time the music was composed. Various non-equal temperament schemes have goals to set certain instances of intervals of the same type unequally, therefore creating beat rates that favor certain musical keys over others. In this case, the frequencies of $A3^4$ through $A4^4$ would be apportioned by calculating G(N) as unequal amounts according to the rules of the desired temperament.

iv.—Calculate Octave Stretch

Using the inharmonicity table and the calculated temperament octave, an initial tuning is calculated (at 820) for the remainder of the eighty-eight notes to satisfy the desired octave stretch. The desired octave stretch is specified by a table, as shown in Table 8, of preferred weighting and stretch values (designated "W" and "S", respectively, in Table 8) for each of the octave types usually used in aural tuning.

TABLE 8

Example of Preferred Weighting and Stretch Values

| | Single Octave Types | | | | | | | | | | | | Double | | Triple | |
|---|---|---|---|---|---|---|---|---|---|---|---|---|---|---|---|---|
| | 12:6 | | 10:5 | | 8:4 | | 6:3 | | 4:2 | | 2:1 | | 4:1 | | 8:1 | |
| | W | S | W | S | W | S | W | S | W | S | W | S | W | S | W | S |
| . . . | | | | | | | | | | | | | | | | |
| C1 | 1.0 | 0.0 | | | | | | | | | | | | | | |
| C#1 | 1.0 | 0.0 | | | | | | | | | | | | | | |
| . . . | | | | | | | | | | | | | | | | |
| D3 | | | | | | | 0.5 | 0.0 | 0.5 | 0.0 | | | | | | |
| D#3 | | | | | | | 0.4 | 0.0 | 0.6 | 0.0 | | | | | | |
| . . . | | | | | | | | | | | | | | | | |
| A#4 | | | | | | | | | 0.9 | 1.0 | 0.1 | 1.0 | | | | |
| B4 | | | | | | | | | 0.8 | 1.0 | 0.2 | 1.0 | | | | |
| . . . | | | | | | | | | | | | | | | | |
| F6 | | | | | | | | | | | 0.5 | 1.0 | 0.5 | 1.0 | | |
| . . . | | | | | | | | | | | | | | | | |
| F7 | | | | | | | | | | | | | 0.5 | 0.0 | 0.5 | 0.0 |
| . . . | | | | | | | | | | | | | | | | |

In the above example, C1 is specified to be a pure 12:6 octave, meaning that the $12^{th}$ partial of the lower note, C1 is tuned to exactly the same frequency of the $6^{th}$ partial of the note an octave higher, C2. A weighting W of 1.0 (100%) indicates that no other octave types are used to calculate the tuning of C1, and a Stretch of 0.0 indicates that the frequencies are exactly equal. Continuing in the above example, D3 is an equally weighted compromise between a pure 6:3 and a pure 4:2 octave, A#4 is weighted 90% as a 4:2 octave 1.0 cent wide and 10% as a 2:1 octave 1.0 cent wide, F6 is an even compromise between a 2:1 single octave and a 4:1 double octave each 1.0 cent wide, and F7 is an equal compromise between a pure double octave and a pure triple octave. A double octave is tuned from a note two octaves away, and a triple octave from a note three octaves away.

Each note's tuning is traceable to the tuning of a temperament note, i.e. tuning calculations move outward from the temperament octave. Therefore only single octave calculations are available in the notes immediately adjacent to the temperament, because notes only as far away as one octave away have already been tuned. Then the other octave types become available as the required notes have been tuned. Notes lower than A3 are always calculated as octaves from notes above, and notes higher than A4 are always calculated as octaves from notes below. Although many alternate sequences may be used, in the preferred embodiment, tunings are calculated in the order shown in Table 9:

TABLE 9

Order of Tuning Calculations

| | Calculated From | Single Octave | Double Octave | Triple Octave |
|---|---|---|---|---|
| 1. A#4 up to D#4 | Below | Available | | |
| 2. G#3 down to D#3 | Above | Available | | |
| 3. E4 up to A5 | Below | Available | Available | |
| 4. D3 down to A2 | Above | Available | Available | |
| 5. A#5 up to C8 | Below | Available | Available | Available |
| 6. G#2 down to A0 | Above | Available | Available | Available |

Each note is calculated by weighting all preferences for that note using frequencies from notes that have already been calculated. In the example above for F7, the calculation would be:

$$F7^1=[0.5*F5^4]+[0.5*F4^8]$$

When the preferences for a note being tuned specify that more than one partial of the note is to be tuned, the tuning for only one of these partials is preferably calculated by adjusting calculations for the other partials using the inharmonicity values. In Table 8, the note D3 is specified to be tuned using both its $6^{th}$ and $4^{th}$ partials as:

$$D3^6=D4^3-0.0 \text{ and}$$

$$D3^4=D4^2-0.0$$

By adjusting the calculated value $D3^4$ by the inharmonicity value $D3^{(4\rightarrow 6)}$, and thus converting from a value for the $4^{th}$ partial into a value for the $6^{th}$ partial, the calculations can be weighted evenly as specified and combined together into a single calculation for only $D3^6$ as $$D3^6=[0.5*(D4^3-0.0)]+[0.5*((D4^2-0.0)+D3^{(4\rightarrow 6)})]$$

When a stretch preference is specified other than 0.0, this value is added or subtracted in such a way to make the octave wider by the stretch amount, that is to make the frequencies of the two notes farther apart. For example, for the second partial of B4:

$$B4^2=[0.8*(B3^4+1.0)]+[0.2*(B3^2+1.0+B4^{(1\rightarrow 2)})]$$

After one partial of a note is calculated, the remaining partials are preferably calculated by using the values from the inharmonicity table. For example:

$$B4^1=B4^2-B4^{(1\rightarrow 2)}$$

$$B4^3=B4^2+B4^{(2\rightarrow 3)}$$

$$B4^4=B4^2+B4^{(2\rightarrow 4)}$$

. . . etc . . .

v.—Refine Tuning

Now that the overall octave stretch of the tuning has been calculated based on the inharmonicity, the tuning preferably is refined (at 830) to correct any interval width irregularities by using the measured inharmonicity value matrix for each note. The goal is to produce a tuning which to the extent possible consists of interval widths that progress smoothly from one note to the next.

Because interval widths are based on the particular frequencies of the coincident partials of two notes, irregularities in the inharmonicity of an actual piano cause irregularities in interval widths. By making small refinements to the tuning of certain notes, the overall regularity of all intervals can be improved. The reference note, usually A4, is the only note that is typically not considered for refinement because this is the note that defines the overall pitch of the instrument (Even if it was considered to refine A4, the same effect could be achieved by adjusting all other 87 notes in an equal but opposite amount).

Intervals are formed by two notes separated by a certain number of semitones as defined by standard harmony theory. Each of these intervals produces one or more aural beat rates due to one or more sets of coincident partials emanating from the two notes forming the interval. Each note may participate in an interval with a note at a specified distance above or below it. As used herein, a subscripted notation identifies the width of an interval (in cents), the interval being identified by the direction of the interval (U for Upper and L for Lower), and the two partial numbers participating in the aural beat. For example, the notation $A4_{U3:2}$ indicates the two notes A4 and D4 (a musical fifth apart, and D4 being lower than A4), because a fifth is the musical interval in which the third partial of the lower note coincides with the second partial of the upper note.

Interval widths are calculated by taking the difference between the offsets of the two partials from the two notes forming the interval. For example, to calculate the width of the upper fourth of F3, a 4:3 fourth with the notes F3 and A#3, the difference in cents between the $4^{th}$ partial of F3 and the $3^{rd}$ partial of A#3 would be calculated:

$$F3_{U4:3}=A\#3^3-F3^4$$

This can be considered the width in cents of the upper fourth of F3. The note F3 also has a lower fourth:

$$F3_{L4:3}=F3^3-C3^4$$

Which is formed with the note a fourth below F3 (C3).

The irregularity of an interval width can be calculated by determining the difference between its width and the weighted average of the widths of a window of similar neighboring intervals. With a window size of 5, the irregularity, J, of $F3_{U4:3}$ may be calculated as:

$$J(F3_{U4:3})=(0.15*D\#3_{U4:3}+0.35*E3_{U4:3}+0.35*F\#3_{U4:3}+0.15*G3_{U4:3})-F3_{U4:3}$$

where 0.15 and 0.35 are constants used to weight the nearer intervals more than the farther intervals.

The irregularity can be used as a correction amount. If the tuning of F3 were adjusted exactly by this amount, it would be exactly equal to the average of the window of neighboring intervals and would be considered a smooth progression.

The difficulty is that there is no way to individually adjust the $4^{th}$ partial of F3 without affecting its other partials. All partials of a note must be tuned together. So by correcting the 4$^{th}$ partial of F3, most likely irregularities will be caused in other intervals based on F3 partials other than the 4$^{th}$ partial. Irregularities may also be caused with other intervals that are based on the 4$^{th}$ partial, such as a major third.

In the preferred embodiment, to determine the tuning corrections that will benefit the most important intervals, an interval prioritization table is set by weighting various interval types for each note in the piano, for example, as shown in Table 10:

TABLE 10

Example of Interval Prioritization Table ("U" for Up, "D" for Down)

| | Octave 4:2 | | Octave 2:1 | | D. Octave 4:1 | | Fifth 6:4 | | Fifth 3:2 | | Fourth 4:3 | | Major Third 5:4 | | Minor Third 6:5 | | Tenth 5:2 | |
|---|---|---|---|---|---|---|---|---|---|---|---|---|---|---|---|---|---|---|
| | U | D | U | D | U | D | U | D | U | D | U | D | U | D | U | D | U | D |
| . . . | | | | | | | | | | | | | | | | | | |
| C2 | .2 | .2 | | | .3 | | .3 | | | | | | | | | | | |
| . . . | | | | | | | | | | | | | | | | | | |
| C4 | .1 | .1 | | | .05 | .05 | .05 | .05 | .05 | .05 | .1 | .1 | .1 | .1 | .05 | .05 | | |
| . . . | | | | | | | | | | | | | | | | | | |
| C7 | | | | .3 | | .3 | | | | .1 | | | | | | | | .3 |
| . . . | | | | | | | | | | | | | | | | | | |

The correction amount for a note as a whole is determined by weighting the irregularity values J of the all the intervals specified in the Interval Prioritization table, producing a correction that will be a compromise of all correction amounts. In the above example, for the note C2, the correction amount Z would be:

$$Z(C2)=0.2*J(C2_{U4:2})+0.2*J(C2_{L4:2})+0.3*J(C2_{U4:1})+0.3*J(C2_{U6:4})$$

This correction amount provides a way to adjust the single note C2 as best as possible such that all of the important intervals that it forms have smooth progressions when compared to similar neighboring intervals. However, making this adjustment will likely cause other intervals involving C2 to have irregularities. Therefore what is needed is way to simultaneously consider 87 corrections considering their impact to the tuning as a whole.

In one embodiment, an iterative approach will be used for the calculation. The calculation of irregularities J(N) and correction amounts Z(N) is performed iteratively i times (at 832). After each iteration, the adjustment amount is divided by the number of iterations and applied to the tuning:

$$T(N,p)\leftarrow T(N,p)+Z(N)/i$$

where T(N) is the tuning of note N.

Thus the correction for each note is performed as relatively small adjustments at a time. Each micro-adjustment represents a movement in the direction of improved consistency in interval widths. Yet the state of the tuning as a whole is re-evaluated after each small adjustment, and therefore each succeeding adjustment is influenced by the results of prior adjustments. This will cause the repeated tuning adjustments to converge towards the most ideal tuning according to the Interval Prioritization table. Final tuning is then stored (at 834).

It is important to construct the refinement process in such a way that it is only sensitive to the irregularities of interval widths and not to their absolute widths. This will protect the adjustments from having a tendency to grow or shrink the overall stretch of the tuning which is set considering only octave type intervals. The described method achieves this.

6. CUMULATIVE PHASE DIFFERENCE

As discussed above and with reference to FIGS. 2, 3A–3C, and 20, the system 100 preferably has a sub-system for calculating and displaying a phase difference. The system 100 may use any conventional process for determining a phase difference, however, the operation of a preferred embodiment and novel cumulative phase calculator is described below. The phase calculator 220 preferably uses the cumulative change in the phase difference between a reference signal and a measured signal to calculate a cumulative phase difference. The phase display 401 (FIG. 2) then provides the technician with a representation of the phase difference.

Figure 3A:
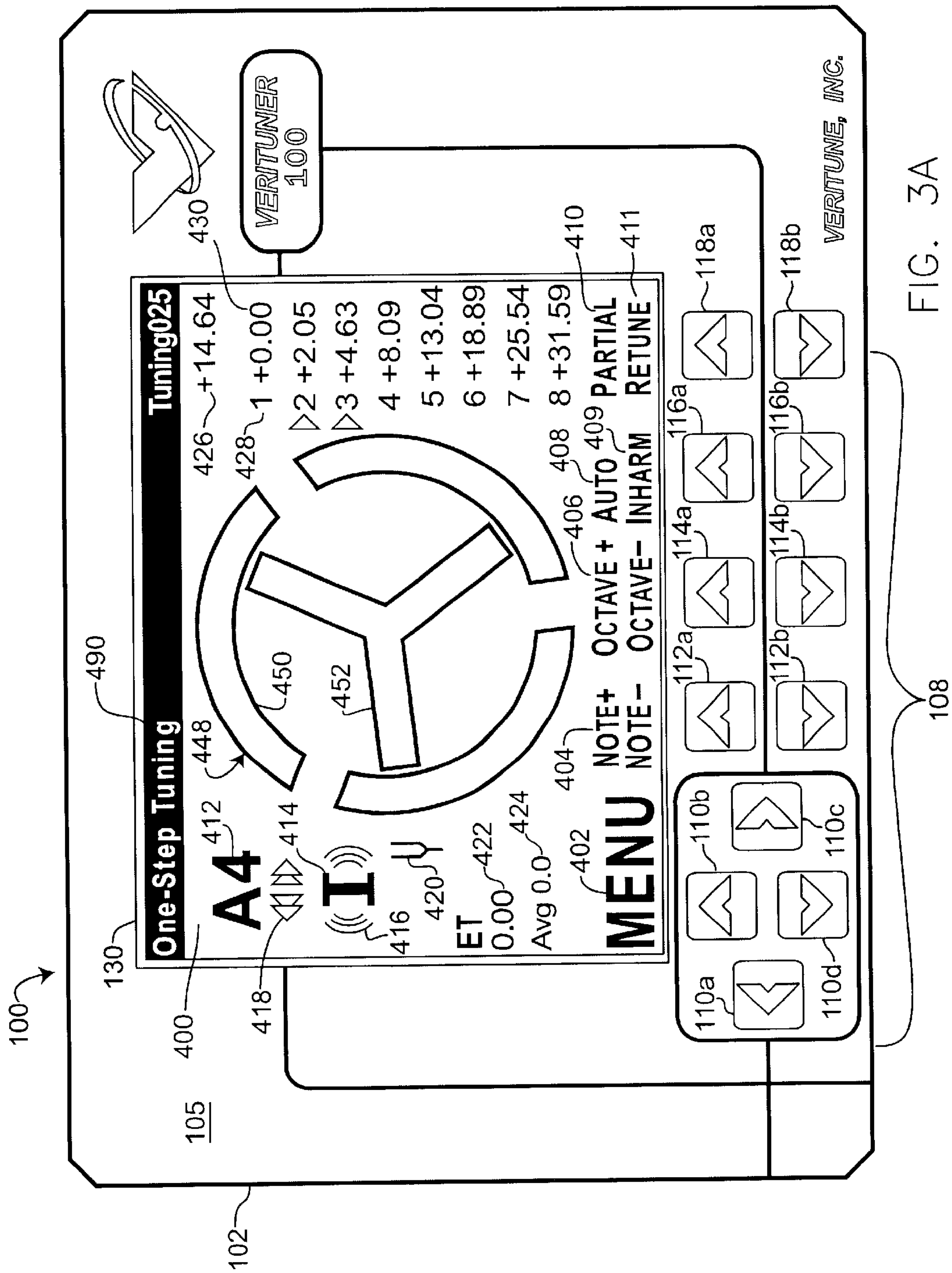
FIG. 3A is a plan view of a preferred embodiment of a system according to the present invention having a display in the phase tuning mode.
Figure 3B:
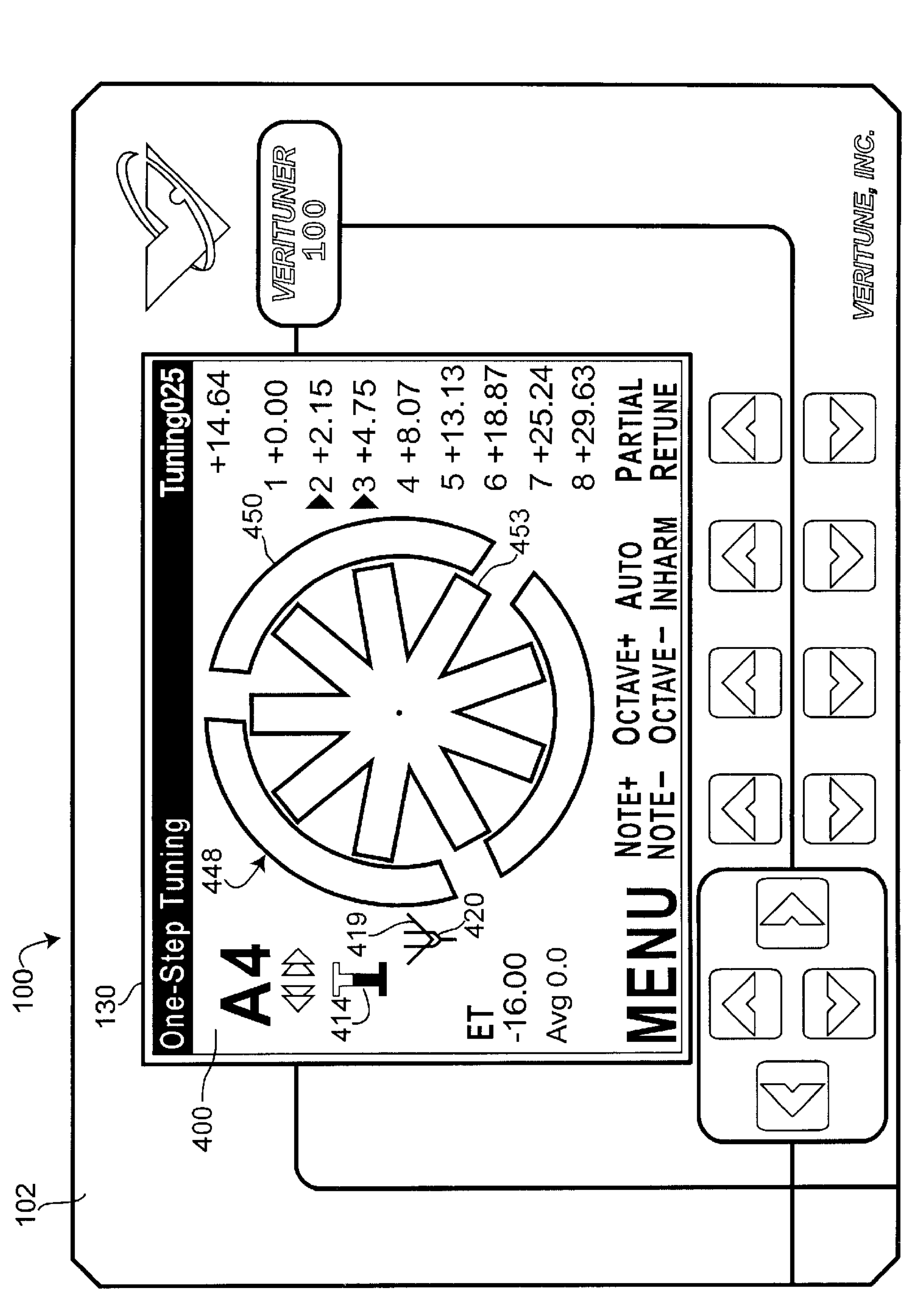
FIG. 3B is a plan view of the system of FIG. 3A when the tone generator is further out of tune as compared to FIG. 3A.
Figure 4:
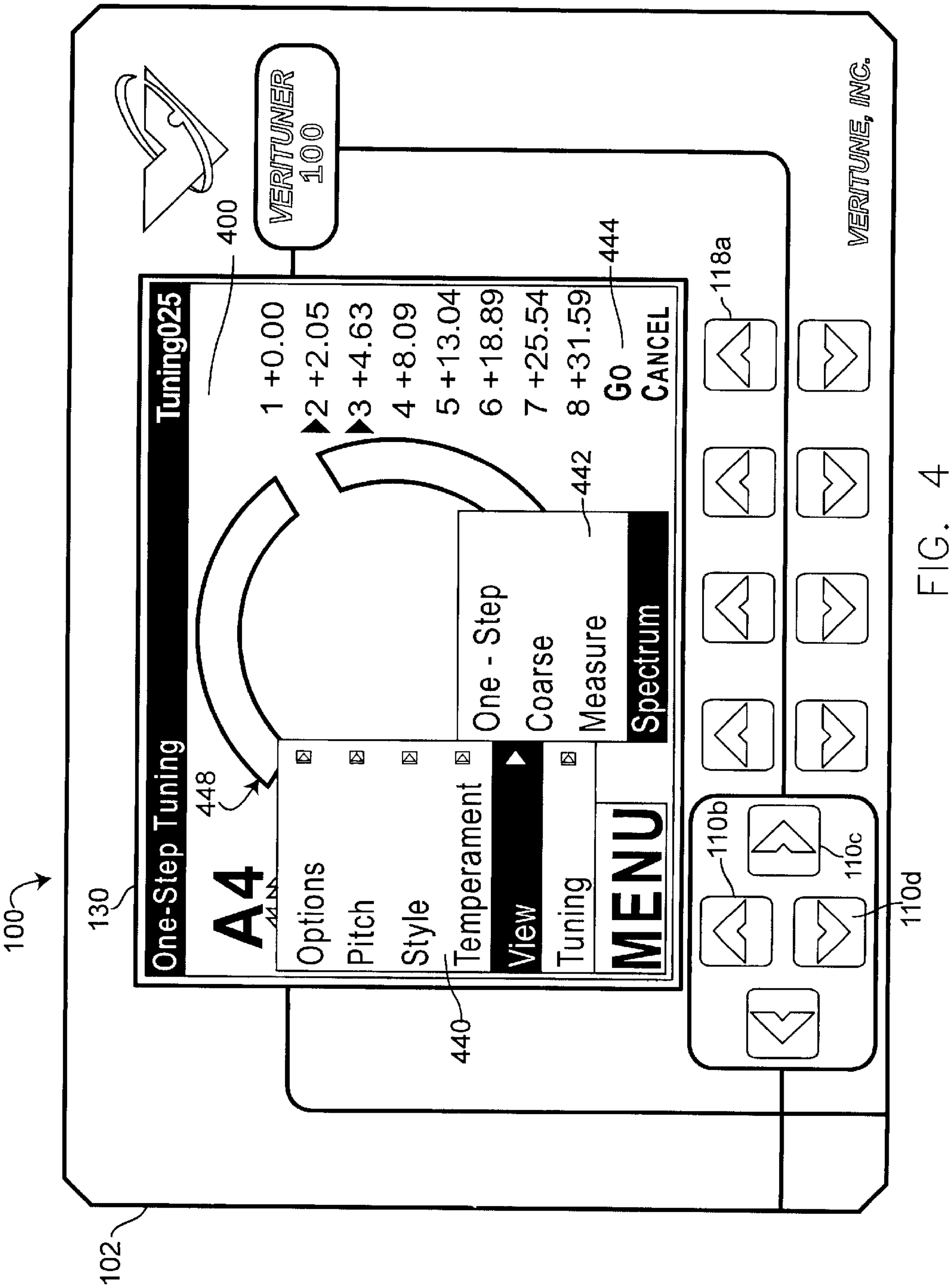
FIG. 4 is a plan view illustrating the use of the menu feature of a preferred embodiment of the system according to the present invention.
Figure 5:
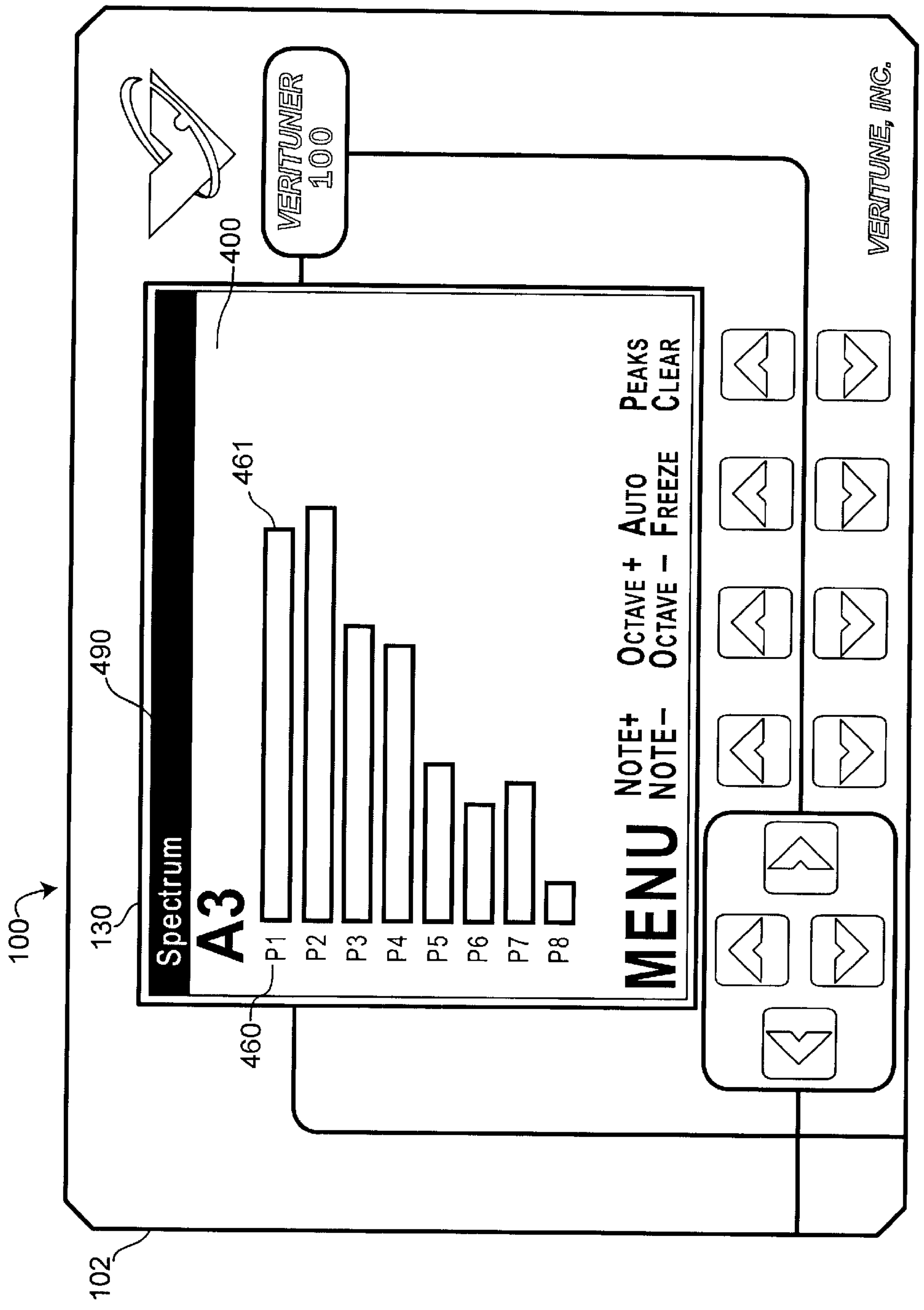
FIG. 5 is a plan view illustrating the spectrum view of a display of a system according to a preferred embodiment of the invention.

In the preferred embodiment, the phase display is a rotating phase indicator 448, as shown in FIGS. 3A and 3B. The phase indicator 448 includes a coarse phase indicator 450 and a fine tuning phase indicator 452. The coarse phase indicator 450 and the fine tuning phase indicator 452 will each rotate about a common center clockwise if the measured signal cumulatively advances in phase as compared to the reference signal. This condition occurs if the measured signal is of a higher frequency. Conversely the coarse phase indicator 450 and the fine tuning phase indicator 452 will rotate counter-clockwise if the measured signal cumulatively recedes in phase. The amount of rotation is proportional the amount of advancement or recession in phase of the measured signal, and therefore the speed of rotation is proportional to the amount the measured frequency is flat or sharp of the target frequency. In the preferred embodiment, when there is a very significant frequency difference between the measured signal and the reference signal, for example, above about 10 cents, the fine tuning phase indicator appears in a stationary state and in a different shape than the three-spoked spinner, such as the asterisk-like symbol shown in FIG. 3B, and only the coarse phase indicator 450 rotates to signify the relatively large frequency difference. When there is a smaller but still significant frequency difference between the measured signal and the reference signal, for example, about 5 cents to about 10 cents, the fine tuning phase indicator 452 appears as the three-spoked spinner and rotates very rapidly, and again the coarse phase indicator 450 rotates to signify the relatively large frequency difference. When there is relatively small frequency difference, for example, below about 5 cents, the coarse phase indica'tor 452 begins to rotate very slowly, and the fine tuning phase indicator 452 also begins to rotate more slowly. In the preferred embodiment, the fine tuning phase indicator 452 stops rotating when the frequency difference is exactly zero cents, at which point the tone generator is considered to be exactly tuned to the target frequency. Typically, a technician will only be able to adjust a tone generator to no closer than about 0.1 cents of its target frequency, at which point there will be only a very slow rotation of the phase indicator. It is noted that neither the coarse phase indicator 450 nor the fine tuning phase indicator 452 need not necessarily stop at any particular degree of rotation, nor do the signals need to be in phase when the measured signal is at its ideal frequency.

Figure 20:
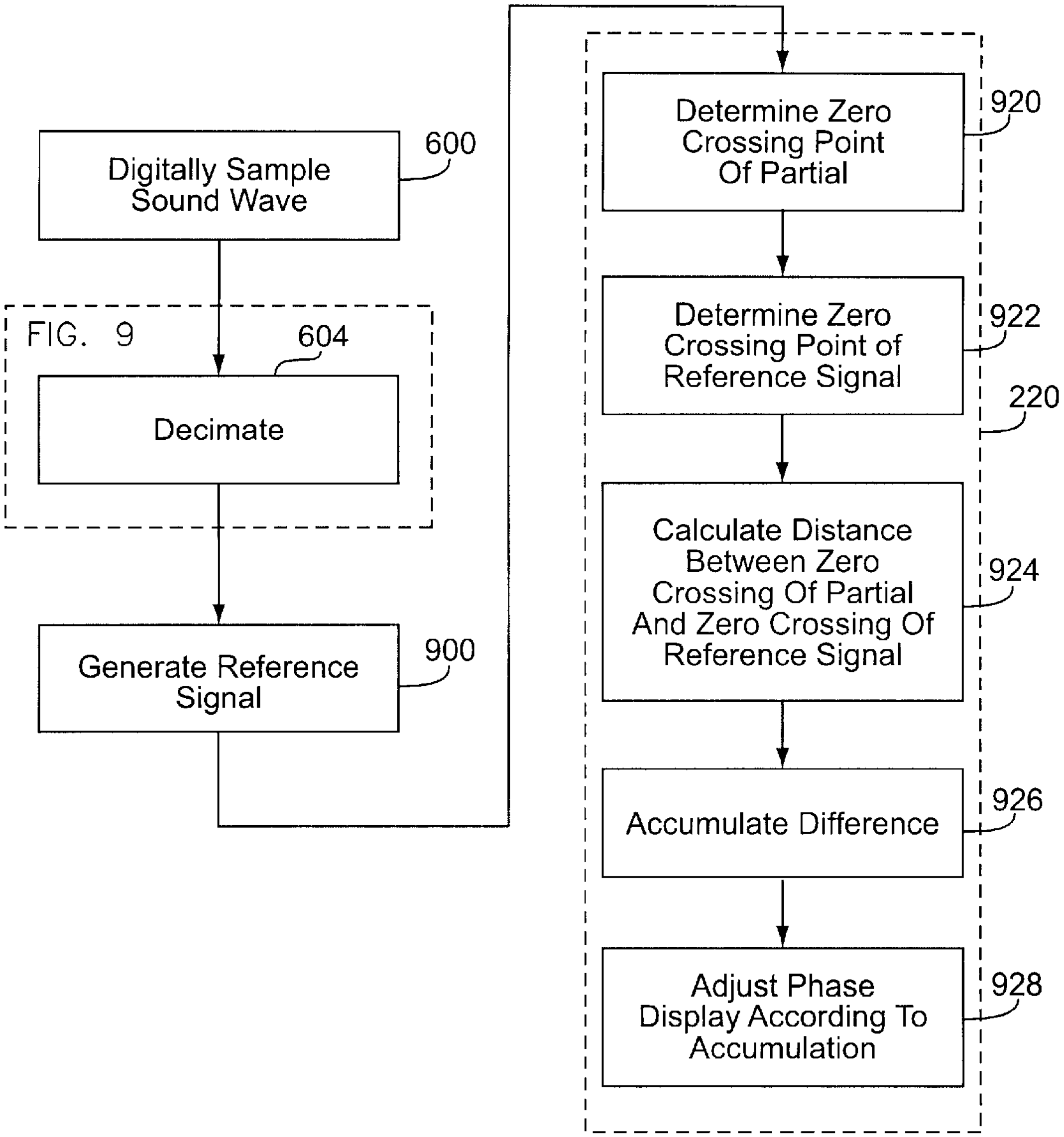
FIG. 20 is a flow diagram of a preferred embodiment of a method for calculating a cumulative phase difference.

With reference to FIG. 20, the digitally sampled sound wave is decimated (at 604, as shown in FIG. 20). Then a reference signal is generated (at 900) at the target tuning frequency. Since the only events of interest in the signals are the zero crossing points, the reference signal 900 has no requirement to be a sine wave, or any kind of wave at all. Its requirement is to produce events at regular intervals. These intervals must be accurately calculated, even to the degree of their placements at fractions of sample times.

This reference signal 900 preferably is implemented as an accumulator to which an advance value is added each sample period. The accumulator should be of sufficiently high precision to provide the frequency resolution required. For instrument tuning applications, a thirty-two bit unsigned integer provides sufficient resolution. An advance value for the accumulator may be calculated such that when this value is added to the accumulator once per sample period, the accumulator overflows at the frequency desired. For example the advance value d can be calculated $$d=2^{b}*(f/s)$$

where b is the number of bits in the accumulator, f is the reference frequency desired, and s is the sample rate. The exact zero crossing time $t_z$ of the reference signal is calculated using the remainder amount after each overflow:

$$t_z=t_1-(a_r/d)$$

where $t_1$ is the time of the sample following the zero cross, and $a_r$ is the reference accumulator value after the overflow (containing the remainder).

The zero crossing points of the measured partial are determined (at 920). The zero crossing points of the reference signal are then determined (at 922). At each zero crossing of the measured signal the phase difference between the signals is calculated (at 924) as the distance in time between the zero crossing points of the two signals. In order to obtain accurate results, these zero crossing points of the measured signal preferably are calculated using a method that places it accurately even at fractions between sample points, such as the method described in the Section 2 above entitled "Determination of a Digital Wavelength".

Each measurement of the phase difference is compared to the previous measurement. The change in this difference is accumulated over time in a phase accumulator (at 926). Repeated equal but opposite changes due to inaccuracies in measurement will cancel each other out, but consistent changes in the same direction will produce an overall accumulation.

In the preferred embodiment, the phase accumulator drives the rotation of the phase indicator 448 in the direction of the accumulation. To adjust the sensitivity of the phase indicator 448, the accumulator value is rolled over each time it surpasses a phase indicator scale factor:

$$a_s=a_s+\phi$$

while $a_s>s$ $$a_s=a_s-s$$

while $a_s<0$ $$a_s=a_s+s$$

where $a_s$ is the accumulator value, $\phi$ is the phase change and s is the phase indicator scale factor. Then the absolute position P of the phase indicator 448 is calculated (at 928) by:

$$P=N\bullet(a_s/s)$$

where N is the number of possible phase indicator positions.

7. INTERVAL BEAT RATES

As discussed above and with reference to FIGS. 2, 6, and 21, the system 100 preferably has a sub-system for calculating and/or displaying interval beat rates. The beat rate calculations and/or display 465 are preferably used in combination with the system 100 to assist a technician in the tuning of a musical instrument. According to a preferred method of tuning a musical instrument with interval beat rates, a frequency of a partial of a first tone generator is measured, and then a substantially real-time frequency of a coincident partial of a second tone generator is measured. A difference between the frequency of the partial of the first tone generator and the substantially real-time frequency of the coincident partial of the second tone generator is calculated. The technician or an automated system may then adjust the first tone generator. In an especially preferred embodiment, the system produces physical manifestations of the calculations, such as by a visual beat display 465.

The beat display 465 (FIG. 2) obtains its information from the tuning calculator 304 and the phase calculator 220. The beat display 465 provides the technician with a representation of one or more beat rates so that the technician can determine a tuning for the musical instrument.

In the embodiment as shown in FIG. 6, an especially preferred beat display 468 is an image representing at least a portion of a piano keyboard 470. This display places the note being tuned in the center indicated by a note indicator 474. In alternate embodiments, a symbol, such as image representative of a tuning hammer may be placed near or on the key corresponding note being tuned. The note indicator 474 associated with the note being tuned is connected by a lead line 473 to the note key corresponding to the tone generator being tuned. Certain other notes 480 which form standard tuning intervals with the note being tuned are connected to beat indicators 476 by lead lines 477. These beat indicators pulsate in time to the beat rate formed by the corresponding interval. In addition to the pulsation, the beat rates 486 are preferably displayed numerically in beats per second above or proximate each beat indicator 476 and note indicator 480. Also in the preferred embodiment, a musical interval indicator 482 and/or a coincident partial indicator 484 is located proximate the note indicator 480 and/or the other indicators corresponding to the note forming the interval with the note being tuned.

Preferably, beat rates are calculated from the difference in frequency between the measured substantially real time frequency of the note being tuned and the previously measured frequencies of other notes forming intervals with the note being tuned. Thus, as the technician tunes the note, the technician can see substantially instantaneously the beat rates of the surrounding intervals produced by the technician's choice of tuning the note.

It is important that the pulsation be displayed in a manner that models what an aural tuning technician hears when listening to beats. An important characteristic of an aural beat is its continuity. Each beat is comprised of a gradual increase and then a gradual decrease in volume. Especially with very slow beats, a human technician is able to determine aurally the beat rate before one full beat has even completed by listening to the rate at which the volume is increasing. The pulsations should be displayed such that there are gradations in the brightness which are sequenced during the period of the beat.

Beat rates are calculated against frequencies of the coincident partials of related notes. In some instances the technician may wish to change the tuning of a related note so that the beat rate between the note being tuned and this other note can be changed. In an alternate embodiment of the invention not previously shown in FIG. 7, whenever a note is re-tuned, the technician may override the originally calculated tuning by pushing a function key designated to the function of overriding calculated tuning frequencies for a note with the partial frequencies measured from the note as tuned by the technician. When the technician utilizes the override feature, displayed beat rates will match what was actually tuned.

Figure 21:
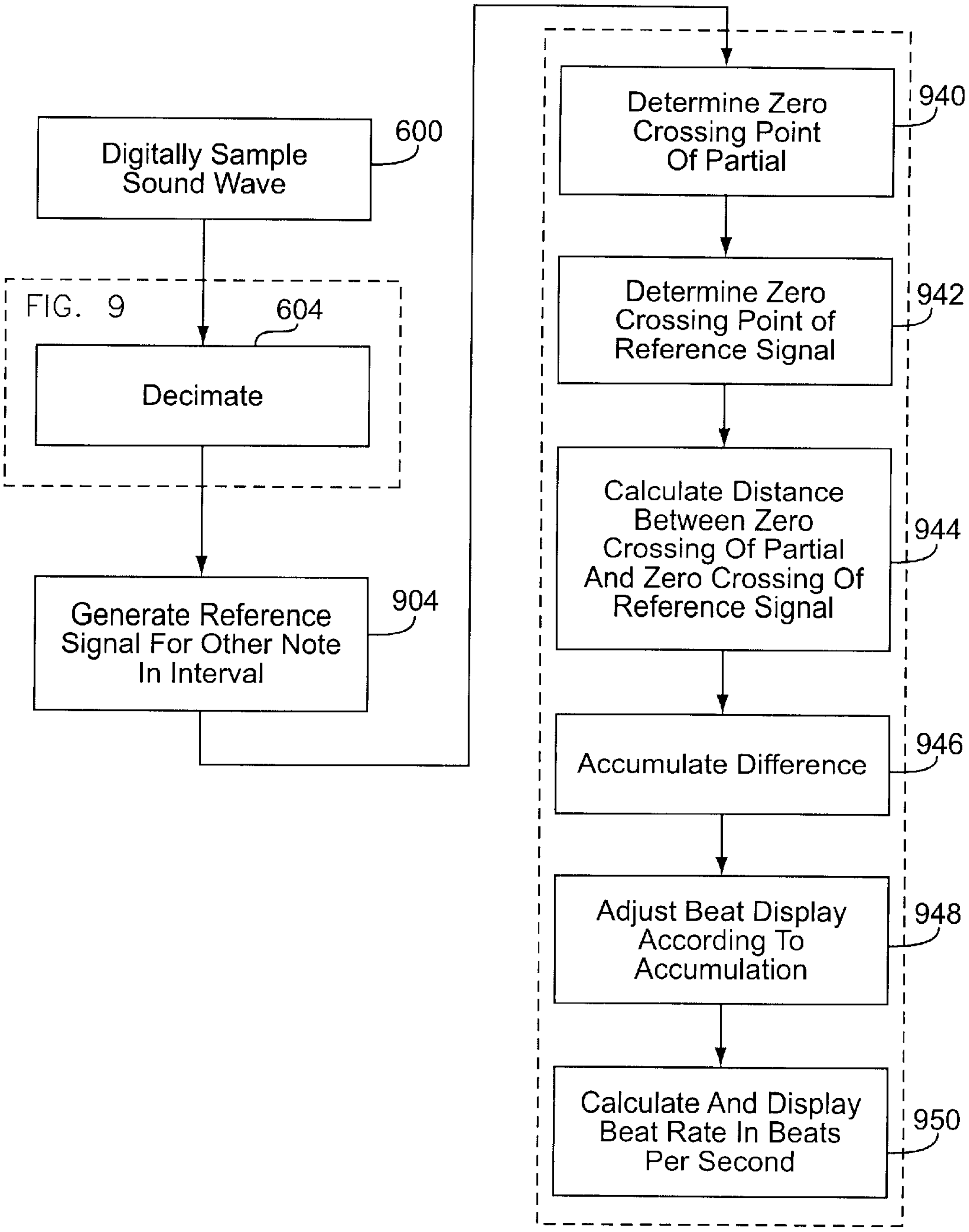
FIG. 21 is a flow diagram of a preferred embodiment of a method for calculating and displaying a beat rate according to the present invention.

With reference to FIG. 21, the digitally sampled sound wave is decimated (at 604, as shown in FIG. 21). Then a reference signal is generated (at 904) at the frequency set to the measured frequency of a coincident partial of another note. Then the zero crossing points of the measured partial are determined (at 940). The zero crossing points of the reference signal are then determined (at 942), the phase difference between the signals is calculated (at 944), and the change in this difference is accumulated over time in a phase accumulator (at 946). These actions (at 940–946) occur in the same manner as described in Section 6 above entitled "Cumulative Phase Difference"

Each beat rate is preferably calculated by the accumulated phase difference (at 948) as the rate of advancement of the phase of the measured signal over the reference signal. Each time the phase advances one full cycle (360 degrees), one beat has occurred between the two signals. Thus the accumulated phase drives gradations in brightness of the beat indicators 476 through one full cycle of gradations for each 360 degrees of phase advancement. Beat rates are then calculated and displayed numerically at 486 in beats per second by measuring the period of each full beat.

Since the display system may be limited in size, it may not be practical to simultaneously display beat rates for every possible interval. The display should easily toggle between displaying the closer intervals, which are preferred for temperament tuning, and the farther intervals, which are preferred for octave tuning. Labels are displayed above certain notes so that the technician can recognize which portion of the keyboard is being displayed.

It should be readily understood by those persons skilled in the art that the present invention is susceptible of a broad utility and application. Many embodiments and adaptations of the present invention other than those herein described, as well as many variations, modifications and equivalent arrangements will be apparent from or reasonably suggested by the present invention and the foregoing description thereof, without departing from the substance or scope of the present invention.

Accordingly, while the present invention has been described herein in detail in relation to specific embodiments, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

What is claimed is:

1. A method to use in tuning a musical instrument having a plurality of adjustable frequency tone generators, each said tone generator capable of producing one or more different order partials, with the first partial for each tone generator corresponding to the lowest frequency of said each tone generator, the method comprising:

measuring a frequency of a partial of a first tone generator of the plurality of tone generators;

measuring a substantially real-time frequency of a coincident partial of a second tone generator of the plurality of tone generators;

calculating a difference between said frequency of a partial of said first tone generator and said substantially real-time frequency of a coincident partial of said second tone generator; and displaying an indicator representative of said calculated difference.

2. The method of claim 1, wherein said indicator is representative of the beat rate generated between said frequency of a partial of said first tone generator and said substantially real-time frequency of a coincident partial of said second tone generator.

3. The method of claim 1, further comprising adjusting said second tone generator based upon said indicator.

4. The method of claim 3, wherein displaying said calculated difference comprises displaying an image representative of at least a portion of a piano keyboard.

5. A method for use in tuning a musical instrument having a plurality of adjustable frequency tone generators, each said tone generator capable of producing one or more different order partials, with the first partial for each tone generator corresponding to the lowest frequency of said each tone generator, the method comprising:

measuring a frequency of a partial of a first tone generator of the plurality of tone generators;

measuring a substantially real-time frequency of a coincident partial of a second tone generator of the plurality of tone generators;

calculating a difference between said frequency of a partial of said first tone generator and said substantially real-time frequency of a coincident partial of said second tone generator; and adjusting said second tone generator based upon said calculated difference.

6. The method of claim 5, further comprising producing a physical manifestation representative of said calculated difference.

7. The method of claim 5, wherein said physical manifestation comprises a visual display.

8. The method of claim 5, wherein said physical manifestation is representative of a beat rate.

9. The method of claim 7, wherein said display comprises an image representative of at least a portion of a piano keyboard.

10. A method for use in tuning a musical instrument having multiple adjustable frequency tone generators, each said tone generator capable of producing one or more different order partials, with the first partial for each tone generator corresponding to the lowest frequency of said each tone generator, the method comprising:

measuring a frequency for at least one partial of a plurality of the multiple tone generators;

measuring a substantially real-time frequency of at least one coincident partial of a selected tone generator of the multiple tone generators;

calculating at least one difference between a frequency of a partial of at least one tone generator of said plurality of tone generators and said substantially real-time frequency of said at least one coincident partial of said selected tone generator; and displaying at least one indicator representative of said at least one calculated difference.

11. The method of claim 10, further comprising adjusting said selected tone generator based upon said indicator.

12. The method of claim 10, wherein calculating at least one difference comprises calculating two beat rates, said two beat rates comprising a beat rate between one partial of said selected tone generator and a partial of a second tone generator of said plurality of tone generators, and calculating a beat rate between a partial of said selected tone generator and a partial of a third tone generator of said plurality of tone generators.

13. The method of claim 12, wherein said at least one indicator comprises a plurality of indicators, each indicator representing a different calculated difference, said plurality of indicators being displayed simultaneously.

14. A system for use in the tuning of a musical instrument having a plurality adjustable frequency tone generators, each said tone generator capable of producing a sound having one or more different order partials, with the first partial for each tone generator corresponding to the lowest frequency of the tone generator, the system comprising:

a wave sampler adapted to convert sound into an electrical signal;

a signal processor receiving said signal and adapted to determine a frequency for each of at least one partial of the sound;

a calculator adapted to calculate at least one difference between a measured frequency of a partial of at least one tone generator of the plurality of tone generators and a measured substantially real-time frequency of a partial of a selected tone generator; and a display representative of said at least one difference.

15. The system of claim 14, wherein said display comprises an image representative of at least a portion of a piano keyboard.

16. The system of claim 15, wherein said display further comprises at least one numeral corresponding to said at least one beat difference.

17. The system of claim 16, wherein said image further comprises individual notes of a piano keyboard, each note associated with at least one tone generator, said numeral proximate one of the notes having a partial used to calculate said at least one beat rate.

18. The system of claim 14, wherein said display is representative of two beat rates.

19. The system of claim 14, wherein said display is representative of three beat rates.

20. The system of claim 14, wherein said display is representative of first and second beat rates, and said display comprises individual notes a piano keyboard, each note associated with a tone generator, one numeral corresponding to said first beat rate proximate one of the notes having a partial used to calculate said first beat rate, and a second numeral corresponding to said second beat rate proximate one of the notes having a partial used to calculate second beat rate.

21. The system of claim 14, further comprising a note detector receiving said signal and adapted to identify which note is associated with the measured sound.

* * * * *